(12) United States Patent
Xi et al.

(10) Patent No.: US 11,222,907 B2
(45) Date of Patent: Jan. 11, 2022

(54) ARRAY SUBSTRATE, ELECTRONIC PAPER DISPLAY PANEL, DRIVE METHOD THEREOF, AND DISPLAY DEVICE

(71) Applicant: Shanghai AVIC OPTO Electronics Co., Ltd., Shanghai (CN)

(72) Inventors: Kerui Xi, Shanghai (CN); Tingting Cui, Shanghai (CN); Feng Qin, Shanghai (CN); Jine Liu, Shanghai (CN); Xiaohe Li, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 409 days.

(21) Appl. No.: 16/188,621

(22) Filed: Nov. 13, 2018

(65) Prior Publication Data

US 2019/0393245 A1 Dec. 26, 2019

(30) Foreign Application Priority Data

Jun. 21, 2018 (CN) .......................... 201810641861.6

(51) Int. Cl.
*G09G 3/20* (2006.01)
*H01L 27/12* (2006.01)

(52) U.S. Cl.
CPC ............ *H01L 27/124* (2013.01); *G09G 3/20* (2013.01); *G09G 2300/0426* (2013.01); *G09G 2300/0439* (2013.01)

(58) Field of Classification Search
CPC .............. G09G 3/3659; G09G 3/3666; G09G 2300/0426; G09G 2300/0814; G09G 2310/0218; G09G 2310/0262; G09G 3/2074; G09G 3/344; G09G 3/3607; G09G 3/364; G09G 2300/0443–0452; G09G 2300/0809; G09G 2300/0885; G09G 3/2085; G09G 3/3677; G09G 2300/08; G09G 2310/0205; G09G 2310/021;

(Continued)

(56) References Cited

U.S. PATENT DOCUMENTS 5,844,535 A * 12/1998 Itoh ..................... G09G 3/3659
345/92
2006/0289939 A1 * 12/2006 Kim ..................... G09G 3/3677
257/368

(Continued)

FOREIGN PATENT DOCUMENTS

CN 106057855 A 10/2016
CN 107092151 A 8/2017

*Primary Examiner* — Amr A Awad
*Assistant Examiner* — Aaron Midkiff
(74) *Attorney, Agent, or Firm* — von Briesen & Roper, s.c.

(57) ABSTRACT

In an array substrate, an electronic paper display panel and a drive method thereof, and a display device, a display area includes multiple sub-display areas. A plurality of scanning lines in each sub-display area are electrically insulated from each other, corresponding scanning lines in different sub-display areas are electrically connected to each other and display time of each sub-display area is controlled through control signal lines. When a control chip and a flexible circuit board are employed, only a small number of control chips and/or flexible circuit boards, or even only one control chip and/or one flexible circuit board, may drive multiple sub-display areas to display pictures.

18 Claims, 22 Drawing Sheets

(58) Field of Classification Search
CPC ............. G09G 3/20; G09G 2300/0439; G09G 3/3446; G09G 2380/02; H01L 27/124–1248; H01L 27/1251; G02F 1/167; G02F 1/16766; G02F 1/1685
USPC .......................... 345/107, 694–696; 359/296
See application file for complete search history.

(56) References Cited

U.S. PATENT DOCUMENTS

| | | | |
|---|---|---|---|
| 2008/0043005 A1* | 2/2008 | Kanda ................... | G09G 3/3233 345/204 |
| 2008/0136765 A1* | 6/2008 | Neugebauer ......... | G09G 3/3677 345/98 |
| 2009/0027325 A1* | 1/2009 | Kim ................... | G02F 1/134336 345/92 |
| 2010/0207851 A1* | 8/2010 | Cok .................... | H01L 27/3255 345/82 |
| 2012/0044432 A1* | 2/2012 | Yeh .................... | G02F 1/13458 349/33 |
| 2014/0043306 A1* | 2/2014 | Min ..................... | G09G 3/3677 345/204 |
| 2015/0108480 A1* | 4/2015 | Xu ..................... | G02F 1/136259 257/59 |
| 2015/0269889 A1* | 9/2015 | Hsu ...................... | G09G 3/3266 345/690 |
| 2017/0092182 A1* | 3/2017 | Fukami ................ | G09G 3/3696 |
| 2018/0067357 A1* | 3/2018 | Katsuta ............... | H01L 27/3297 |

* cited by examiner

ARRAY SUBSTRATE, ELECTRONIC PAPER DISPLAY PANEL, DRIVE METHOD THEREOF, AND DISPLAY DEVICE

CROSS-REFERENCES TO RELATED APPLICATIONS

This application claims priority to a Chinese patent application No. 201810641861.6 filed on Jun. 21, 2018, disclosure of which is incorporated herein by reference in its entirety.

TECHNICAL FIELD

The present disclosure relates to the field of display techniques and, in particular, to an array substrate, an electronic paper display panel, a drive method thereof, and a display device.

BACKGROUND

The electronic paper display is a flat panel display technique with paper-like display performance. An electronic paper display panel has a huge application potential in the fields of electronic readers (electronic books), electronic price tags, industrial instruments and meters, dynamic display billboards, media products, and the like.

Taking an oblong electronic paper display screen as product tags for example, the current oblong electronic paper display screen usually includes a plurality of small electronic paper display modules that are independently controlled and displayed. The spacing between each independent electronic paper display module is very small and different control chips work together to achieve the display effect of the entire oblong electronic paper display screen. However, because the plurality of small electronic paper display modules are independently controlled, a plurality of control chips and a plurality of flexible circuit boards need to be arranged to provide drive signals for data signal lines within the display screen. A considerable number of control chips are required, for example, electronic paper products longer than 1.5 m such as signs and billboards need 10 control chips, and the costs are high.

SUMMARY

The present disclosure provides an array substrate, an electronic paper display panel a drive method thereof, and a display device, so as to solve the problem in which a large number of control chips are required in the existing array substrate, electronic paper display panel and display device, causing high costs.

In a first aspect, the present disclosure provides an array substrate including a display area and a non-display area. The display area includes multiple sub-display areas and a plurality of data lines, each of the multiple sub-display area includes a plurality of scanning lines, and the plurality of data lines intersect the plurality of scanning lines to form a plurality of sub-pixels. In the display area, sub-pixels in the same column are electrically connected to the same data line, and in each sub-display area, sub-pixels in the same row are electrically connected to the same scanning line. A plurality of scanning lines in each sub-display area include a first scanning line, a second scanning line, . . . , and an Nth scanning line which are electrically insulated from each other. The first scanning lines in different sub-display areas are electrically connected to each other, the second scanning lines of different sub-display areas are electrically connected to each other, . . . , and the Nth scanning lines of different sub-display areas are electrically connected to each other, where N is an integer greater than or equal to 3. The array substrate further includes at least two control signal lines. All sub-pixels in each sub-display area are electrically connected to the same control signal line and sub-pixels in different sub-display areas are electrically connected to different control signal lines.

In a second aspect, the present disclosure further provides an electronic paper display panel. The electronic paper display panel provided by the present disclosure includes an array substrate, an electrophoretic film and a common electrode layer. The electrophoretic film is disposed between the common electrode layer and the array substrate and covers multiple sub-display areas of the array substrate. The array substrate may be any array substrate provided by the present disclosure.

In a third aspect, the present disclosure further provides a display device including any electronic paper display panel provided by the present disclosure.

In a fourth aspect, the present disclosure further provides a drive method for an electronic paper display panel. The electronic paper display panel includes an array substrate including a display area and a non-display area. The display area includes multiple sub-display areas and multiple data lines, each sub-display area includes a plurality of scanning lines and the plurality of scanning lines are intersected with the multiple data lines to form a plurality of sub-pixels. In each sub-display area, sub-pixels in the same row are electrically connected to a same scanning line, and in the display area, sub-pixels in the same column are electrically connected to a same data line. A plurality of scanning lines in each sub-display area include a first scanning line, a second scanning line, . . . , and an Nth scanning line which are electrically insulated from each other. The first scanning lines in different sub-display areas are electrically connected to each other, the second scanning lines in different sub-display areas are electrically connected to each other, . . . , and the Nth scanning lines in different sub-display areas are electrically connected to each other, where N is an integer greater than or equal to 3. The array substrate further includes at least two control signal lines. All sub-pixels in each sub-display area are electrically connected to the same control signal line and sub-pixels in different sub-display areas are electrically connected to different control signal lines.

The drive method includes: controlling, through at least two control signal lines, sub-pixels in at least one sub-display area to be turned on and, meanwhile, controlling sub-pixels in other sub-display areas to be turned off; inputting scanning signals to multiple scanning lines sequentially; and charging, through multiple data lines, all sub-pixels that are turned on.

In the array substrate, electronic paper display panel and display device provided by embodiments of the present disclosure, the display area includes multiple sub-display areas. A plurality of scanning lines in each sub-display area are electrically insulated from each other, corresponding scanning lines in different sub-display areas are electrically connected to each other and display time in each sub-display area is controlled through control signal lines, reducing the number of scanning signal pins and saving costs. When a control chip and a flexible circuit board are employed, only a small number of control chips and/or flexible circuit boards, or even only one control chip and/or one flexible circuit board, may drive multiple sub-display areas to display information. Compared with the related art, the number of control chips and flexible circuit boards may be reduced, thus saving costs.

BRIEF DESCRIPTION OF DRAWINGS

To illustrate technical solutions in embodiments of the present disclosure or in the related art more clearly, drawings used in description of the embodiments or the related art will be briefly described below. Apparently, the drawings described below illustrate only part of the embodiments of the present disclosure, and those skilled in the art may obtain other drawings based on the drawings described below on the premise that no creative work is done.

DETAILED DESCRIPTION

The technical solutions of the present disclosure will be described clearly and completely with reference to the drawings through embodiments from which the object, technical solutions and advantages of the present disclosure will be apparent. Apparently, the embodiments described below are merely a part, not all, of embodiments of the present disclosure. On the basis of the embodiments described herein, all other embodiments obtained by those skilled in the art without creative work are within the scope of the present disclosure.

Figure 1:
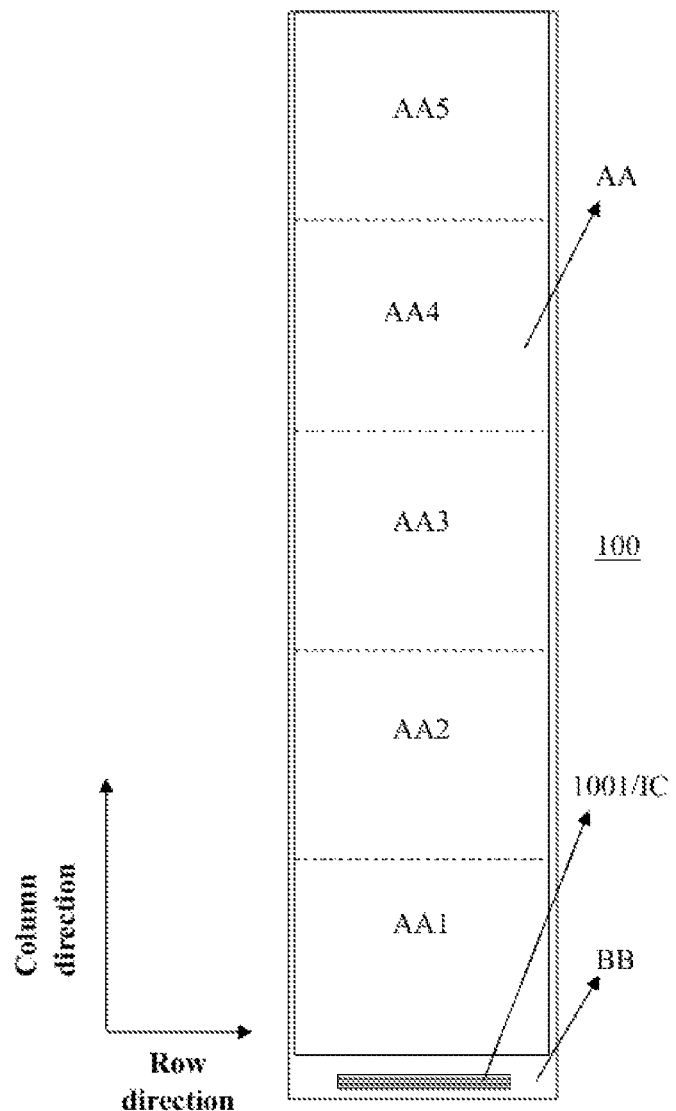
FIG. 1 is a structural diagram of an array substrate according to an embodiment of the present disclosure.

FIG. 1 is a structural diagram of an array substrate according to an embodiment of the present disclosure. With reference to FIG. 1, the array substrate panel 100 includes a display area AA and a non-display area BB disposed on at least one end of the display area AA or disposed around the display area AA. The display area AA includes at least two sub-display areas and exemplarily illustrated in FIG. 1, five sub-display areas are disposed on the array substrate, i.e., a first sub-display area AA1, a second sub-display area AA2, a third sub-display area AA3, a fourth sub-display area AA4 and a fifth sub-display area AA5. A plurality of sub-display areas are sequentially disposed along the column direction to form a strip-shaped array substrate 100 extending along the column direction, and the array substrate may individually control each sub-display area, so that different pictures are displayed in each sub-display area in a display panel, which is formed by the array substrate. The non-display area BB of the array substrate 100 is further provided with a bonding area 1001 disposed on one end of the array substrate 100, which is along the column direction. For example, the bonding area 1001 may be disposed in the non-display area BB located at one end of the array substrate, which is closer to the first sub-display area AA1, and is configured to bond a control chip IC and/or a flexible circuit board. For example, the array substrate 100 may be provided with one control chip IC and/or one flexible circuit board, and a plurality of sub-display areas on the array substrate 100 may be simultaneously driven through the one control chip IC and/or one flexible circuit board to display or refresh pictures individually.

Figure 2:
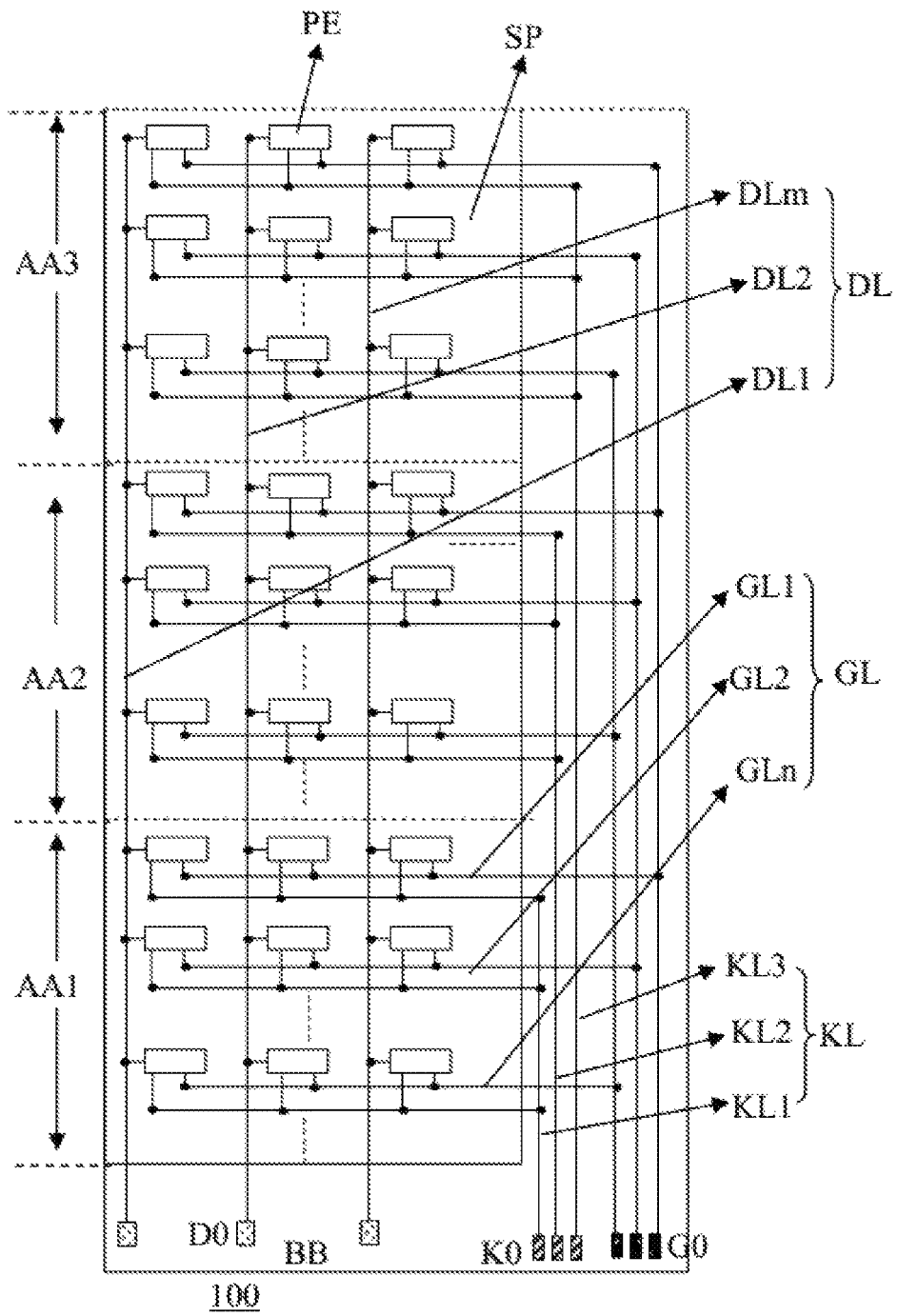
FIG. 2 is a structural diagram of pixels of the array substrate illustrated in FIG. 1.
Figure 3:
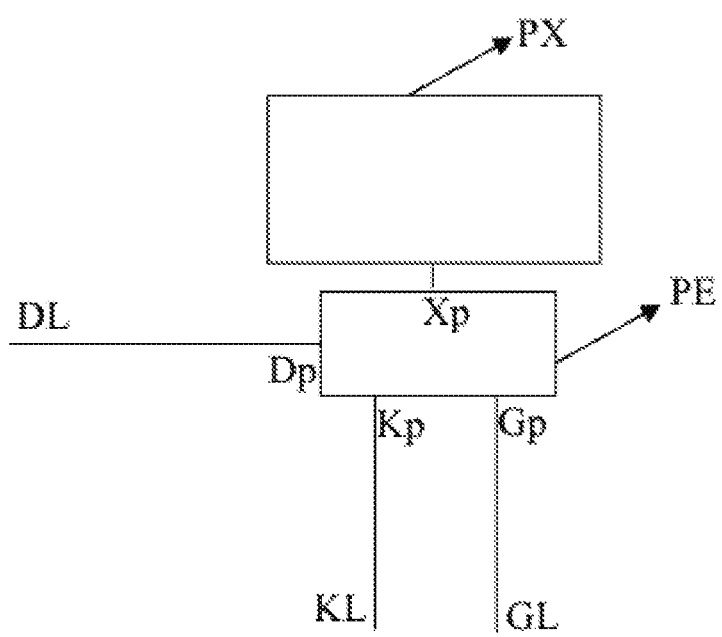
FIG. 3 is a structural diagram of one sub-pixel of the array substrate illustrated in FIG. 1.

FIG. 2 is a structural diagram of pixels of the array substrate illustrated in FIG. 1, and FIG. 3 is a structural diagram of one sub-pixel of the array substrate illustrated in FIG. 1. For clarity, only part of sub-display areas of the array substrate are exemplarily illustrated in FIG. 2. The array substrate 100 illustrated in FIGS. 1, 2 and 3 includes at least the first sub-display area AA1, the second sub-display area AA2 and the third sub-display area AA3. The three sub-display areas are arranged along the column direction and form a strip-shaped array substrate extending along the column direction. The array substrate 100 is further provided with a plurality of data lines DL extending along the column direction and disposed along the row direction. The plurality of data lines DL separately pass through the first sub-display area AA1, the second sub-display area AA2 and the third sub-display area AA3 sequentially, i.e., the first sub-display area AA1, the second sub-display area AA2 and the third sub-display area AA3 share the plurality of data lines DL. Each sub-display area (AA1, AA2, AA3 and . . . ) is separately provided with a plurality of scanning lines GL and in each sub-display area (AA1, AA2, AA3 and . . . ), the plurality of scanning lines GL are extended along the row direction and disposed along the column direction. In each sub-display area (AA1, AA2, AA3 and . . . ), the plurality of data lines DL are intersected with the plurality of scanning lines GL to form a plurality of sub-pixels SP disposed in an array.

In the display area AA, sub-pixels SP in the same column are electrically connected to the same data line DL and in each sub-display area (AA1, AA2, AA3 and . . . ), sub-pixels SP in the same row are electrically connected to the same scanning line GL. For example, the plurality of data lines DL include a first data line DL1, a second data line DL2, . . . , and an Mth data line DLm, which are electrically insulated from each other and which are electrically connected to sub-pixels SP in the first column, the second column, . . . , and the Mth column on the array substrate 100 respectively; in each sub-display area (AA1, AA2, AA3 and . . . ), the plurality of scanning lines GL include a first scanning line GL1, a second scanning line GL2, . . . , and an Nth scanning line GLn, which are electrically insulated from each other and which are electrically connected to sub-pixels SP in the first row, the second row, . . . , and the Nth row in sub-display areas respectively, where M and N are integers greater than or equal to 3.

In this embodiment, the first scanning lines GL1 in different sub-display areas (AA1, AA2, AA3 and . . . ) are electrically connected to each other, the second scanning lines GL2 in the different sub-display areas (AA1, AA2, AA3 and . . . ) are electrically connected to each other, . . . , the Nth scanning lines GLn in the different sub-display areas (AA1, AA2, AA3 and . . . ) are electrically connected to each other.

Specifically, the non-display area BB of the array substrate 100 is further provided with scanning signal pins G0. The first scanning line GL1 in the second sub-display area AA2 and the first scanning line GL1 in the third sub-display area AA3 are simultaneously electrically connected to the first scanning line GL1 in the first sub-display area AA1, and are electrically connected to a corresponding scanning signal pin G0 in the non-display area BB through the first scanning line GL1 in the first sub-display area AA1. The second line GL2 in the second sub-display area AA2 and the second scanning line GL2 in the third sub-display area AA3 are simultaneously electrically connected to the second scanning line GL2 in the first sub-display area AA1, and are electrically connected to a corresponding scanning signal pin G0 in the non-display area BB through the second scanning line GL2 in the first sub-display area AA1. . . . The Nth scanning line GLn in the second sub-display area AA2 and the Nth scanning line GLn in the third sub-display area AA3 are simultaneously electrically connected to the nth scanning line GLn in the first sub-display area AA1, and are electrically connected to a corresponding scanning signal pin G0 in the non-display area BB through the Nth scanning line GLn in the first sub-display area AA1. . . . In this way, corresponding scanning lines GL in the different sub-display areas (AA1, AA2, AA3, and . . . ) may be electrically connected to the same scanning signal pin G0, to reduce the number of scanning signal pins G0. In the array substrate 100 composed of a plurality of sub-display areas (AA1, AA2, AA3, and . . . ), scanning signal pins may no longer be individually set for one or more sub-display areas. Further, scanning signal pins may only be set at one end which is in the column direction (for example, one end which is closer to the first sub-display area AA1) of the array substrate, and all scanning lines GL in other sub-display areas may be electrically connected to scanning signal pins through the scanning lines GL in the sub-display area (for example, the first sub-display area AA1).

The array substrate 100 further includes at least two control signal lines KL. All sub-pixels SP in each sub-display area (AA1, AA2, AA3 and . . . ) are electrically connected to the same control signal line KL, and sub-pixels SP in different sub-display areas (AA1, AA2, AA3 and . . . ) are electrically connected to different control signal lines KL.

For example, each control signal line KL may be disposed in one-to-one correspondence to sub-display areas (AA1, AA2, AA3 and . . . ) and the number of control signal lines KL is equal to the number of the sub-display areas (AA1, AA2, AA3 and . . . ). Multiple sub-display areas (AA1, AA2, AA3 and . . . ) include at least a first sub-display area AA1, a second sub-display area AA2 and a third sub-display area AA3, and the control signal lines KL include at least a first control signal line KL1, a second control signal line KL2 and a third control signal line KL3. All sub-pixels SP in the first sub-display area AA1 are electrically connected to the first control signal line KL1, all sub-pixels SP in the second sub-display area AA2 are electrically connected to the second control signal line KL2, and all sub-pixels SP in the third sub-display area AA3 are electrically connected to the third control signal line KL3, and so on. When only one sub-display area needs to display pictures, or one sub-display area needs to update displayed pictures, the control signal lines KL electrically connected to the sub-display area are turned on while control signal lines KL electrically connected to other sub-display areas are turned off; multiple scanning lines GL are turned on to scan multiple rows of sub-pixels sequentially from top to bottom; and data signals are written through the multiple data lines DL, so that each sub-display area can be individually controlled. When two or more sub-display areas need to display pictures, or two or more sub-display areas need to update displayed pictures, pictures in the two or more sub-display areas are updated sequentially in the above-mentioned way.

Specifically, for example, each sub-pixel SP further includes a pixel drive module PE and a pixel electrode PX. The pixel drive module PE includes at least a control signal input terminal Kp, a scanning signal input terminal Gp, a data signal input terminal Dp, and a data signal output terminal Xp. The control signal input terminal Kp in the pixel drive module PE is electrically connected to a corresponding control signal line KL, the control signal line KL provides switching signals for the pixel drive module PE to control the corresponding pixel drive module PE to be turned off or turned on, and another end of the control signal line KL is electrically connected to a control signal pin K0 in the non-display area BB. The scanning signal input terminal Gp in the pixel drive module PE is electrically connected to a corresponding scanning line GL, and another end of the scanning line GL is electrically connected to a scanning signal pin G0 in the non-display area BB. The data signal input terminal Dp in the pixel drive module PE is electrically connected to a corresponding data line DL, the data signal output terminal Xp in the pixel drive module PE is electrically connected to the pixel electrode PX and another end of the data line DL is electrically connected to a data signal pin D0 in the non-display area BB. When the pixel drive module PE in a sub-display area is turned on under the control of the switching signals provided by the control signal line KL, all pixel drive modules PE in the sub-display area are turned on, the multiple scanning lines GL scan all sub-pixels SP in the sub-display area sequentially from top to bottom, and the data lines DL provide the data signals for the pixel electrode PX in the corresponding sub-pixel SP, so that the sub-display area can display pictures or update displayed pictures.

In this embodiment, the bonding area 1001 is merely disposed in the non-display area BB on one end of the array substrate, the data signal pins D0, scanning signal pins G0 and control signal pins K0 are disposed in the bonding area 1001 in the array substrate, and the data lines DL, scanning lines GL and control signal lines KL in all sub-display areas are electrically connected to the corresponding pins in the bonding area 1001. The array substrate 100 further includes a control chip IC, for example, only one control chip IC. The control chip IC is bound in the bonding area 1001 in the array substrate, and the data signal pins D0, scanning signal pins G0 and control signal pins K0 are electrically connected to the corresponding drive pins in the control chip IC. The array substrate, for example, can further include a flexible circuit board, and the drive pins in the control chip IC are electrically connected to an external drive circuit through traces on the flexible circuit board.

The display area of the array substrate provided in this embodiment includes multiple sub-display areas which can be individually controlled. A plurality of scanning lines in each sub-display area are electrically insulated from each other, and corresponding scanning lines in different sub-display areas are electrically connected to each other, and the display time in each sub-display area is controlled through control signal lines. Scanning signal pins may be disposed merely in the non-display area corresponding to one sub-display area and scanning lines in other sub-display areas are electrically connected to the scanning signal pins through the scanning lines in the sub-display areas, thereby reducing the number of the scanning signal pins. Each data line sequentially passes through the multiple sub-display areas, so that sub-pixels in the same row in different sub-display areas may share the same data line, thereby reducing the number of the data signal pins and saving costs. At the same time, even if corresponding scanning lines in different sub-display areas share the same scanning data pin and corresponding data lines in different sub-display areas share the same data signal pin, the separate control of different sub-display areas may also be achieved by controlling the display and turning off of each sub-display area through the control signal lines.

Through the above-mentioned configuration method, all signal pins are disposed in the bonding area on the same location (for example, on one end of the array substrate), and when the control chip and the flexible circuit board are employed, only a small number of control chips and flexible circuit boards, or even only one control chip and one flexible circuit board, can drive multiple sub-display areas to display pictures. Compared with the related art in which multiple control chips and multiple flexible circuit boards are required, this configuration method may reduce the number of control chips and flexible circuit boards, thereby saving costs.

Figure 4:
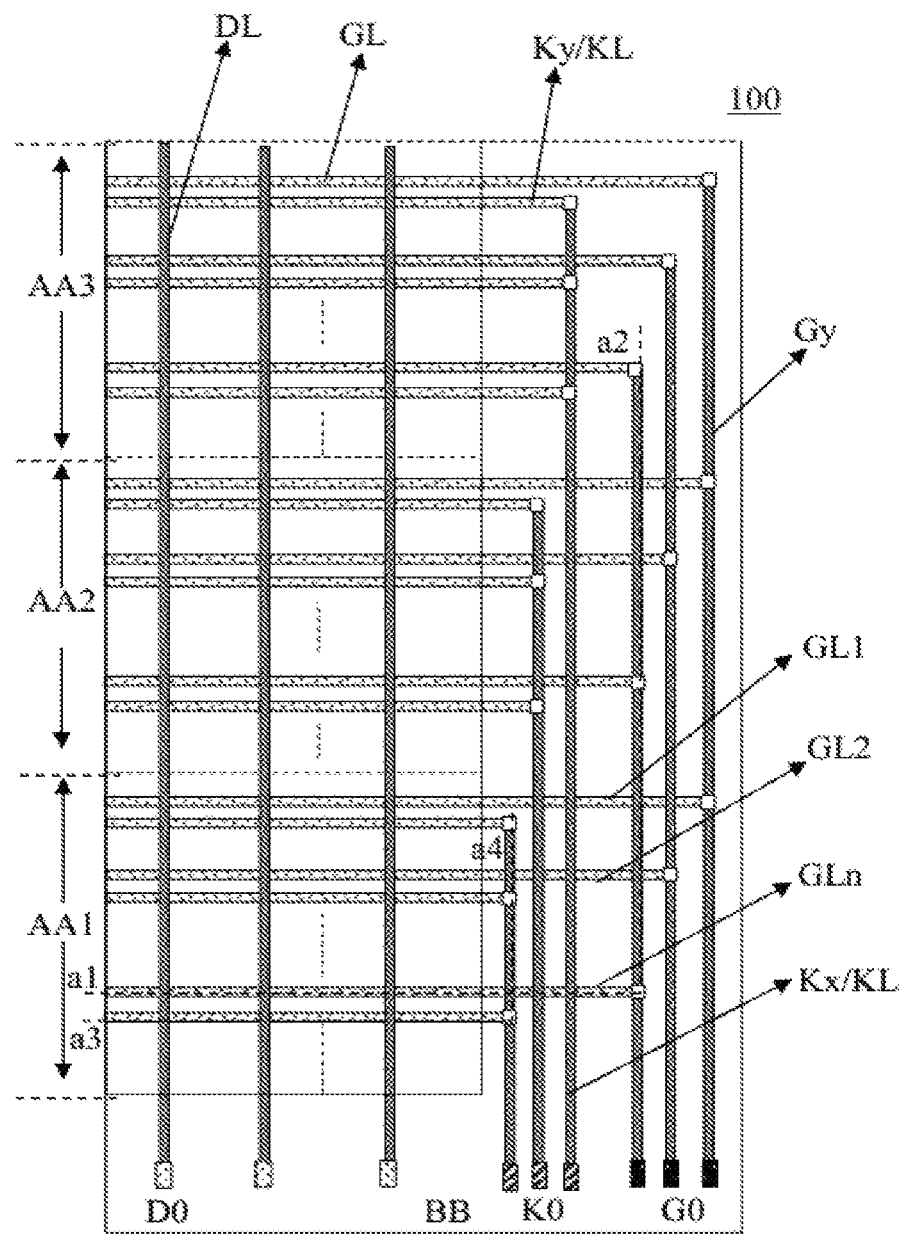
FIG. 4 is a schematic diagram of a wiring method of the array substrate illustrated in FIG. 1.
Figure 5:
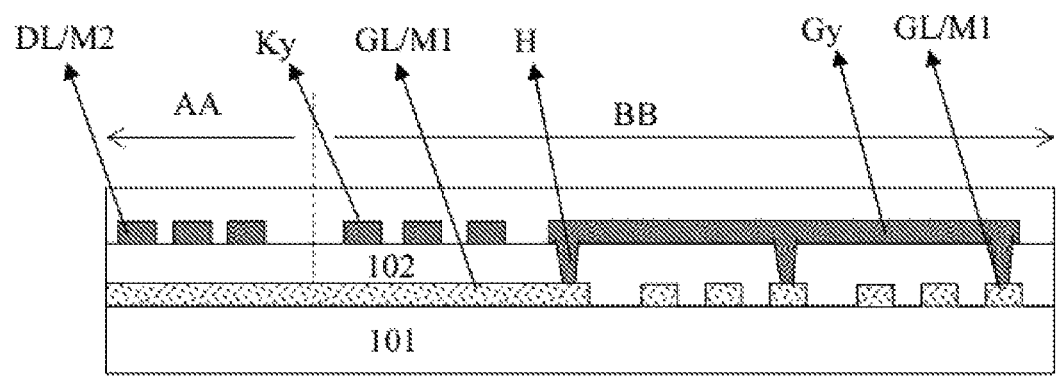
FIG. 5 is a sectional view taken along a line a1-a2 of FIG. 4.
Figure 6:
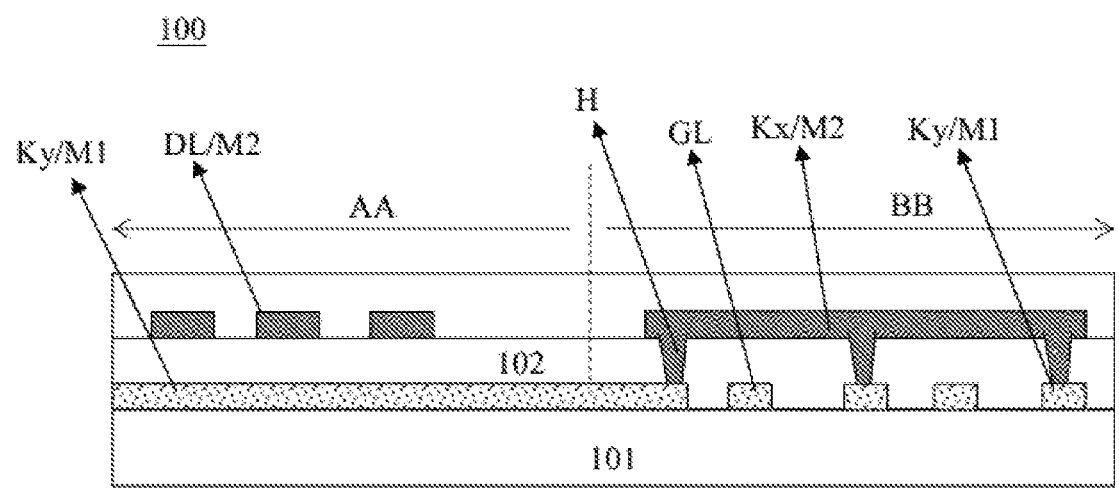
FIG. 6 is a sectional view taken along a line a3-a4 of FIG. 4.

FIG. 4 is a schematic diagram of a wiring method of the array substrate illustrated in FIG. 1, FIG. 5 is a sectional view taken along a line a1-a2 of FIG. 4, and FIG. 6 is a sectional view taken along a line a3-a4 of FIG. 4. FIGS. 4, 5 and 6 show a wiring method in different sub-display areas. In this embodiment, an array substrate 100 includes at least a first sub-display area AA1, a second first sub-display area AA2 and a third first sub-display area AA3. Multiple sub-display areas (AA1, AA2, AA3 and . . . ) are disposed in the column direction. A plurality of data lines DL are extended along the column direction and disposed along the row direction, and the plurality of data lines DL pass through the first sub-display area AA1, the second sub-display area AA2 and the third sub-display area AA3 sequentially. Sub-pixels in the same column are electrically connected to the same data line DL. A plurality of scanning lines GL are disposed in each sub-display area (AA1, AA2, AA3 and . . . ). In each sub-display area, the plurality of scanning lines GL are extended along the row direction and disposed along the column direction. In each sub-display area, sub-pixels in the same row are electrically connected to the same scanning line GL. Specifically, the plurality of scanning lines GL include a first scanning line GL1, a second scanning line GL2, . . . , and an Nth scanning line GLn, which are electrically insulated from each other and which are electrically connected to sub-pixels in the first row, the second row, . . . , and the Nth row in the sub-display area respectively, where N is an integer greater than equal to 3.

In this embodiment, the array substrate 100 further includes multiple scanning signal lead wires Gy extending along the column direction and disposed along the row direction in the non-display area BB. Corresponding scanning lines GL in different sub-display areas are electrically connected to each other through the scanning signal lead wires Gy. Specifically, the first scanning line GL1 in the first sub-display area AA1, the first scanning line GL1 in the second sub-display area AA2 and the first scanning line GL1 in the third sub-display area AA3 are electrically connected to a corresponding scanning signal pin G0 through the same scanning signal lead wire Gy; the second scanning line GL2 in the first sub-display area AA1, the second scanning line GL2 in the second sub-display area AA2 and the second scanning line GL2 in the third sub-display area AA3 are electrically connected to a corresponding scanning signal pin G0 through the same scanning signal lead wire Gy; . . . ; and the Nth line GLn in the first sub-display area AA1, the Nth scanning line GLn in the second sub-display area AA2 and the Nth scanning line GLn in the third sub-display area AA3 are electrically connected to a corresponding scanning signal pin G0 through the same scanning signal lead wire Gy.

Specifically, a plurality of scanning lines GL in the multiple sub-display areas are disposed in the same film, and multiple scanning signal lead wires Gy are disposed in a film different from the film where the plurality of scanning lines GL in the multiple sub-display area are disposed.

With reference to FIG. 5, in this embodiment, the array substrate 100 includes: a substrate 101, a first metal layer M1, a first passivation layer 102, and a second metal layer M2. The first metal layer M1 is disposed on the substrate 101 and includes a plurality of scanning lines GL which are electrically insulated from each other, the plurality of scanning lines GL are extended along the row direction and disposed along the column direction. In the manufacturing process, for example, the plurality of scanning lines GL may be formed by patterning of the first metal layer M1. The first passivation layer 102 is disposed on the substrate 101 and the first metal layer M1 is covered by the first passivation layer 102. The second metal layer M2 is disposed on the first passivation layer 102. The second stacked metal layer M2 and the first metal layer M1 are stacked and insulated from each other through the first passivation layer 102. The second metal layer M2 includes a plurality of data lines DL and multiple scanning signal lead wires Gy electrically insulated from each other, the multiple scanning signal lead wires Gy are extended along the column direction and disposed along the row direction, the plurality of data lines DL are extended along the column direction and disposed along the row direction. In the manufacturing process, for example, the plurality of data lines DL and the multiple scanning signal lead wires Gy may be formed by patterning of the second metal layer M2. The first scanning lines GL1 in the first sub-display area AA1, the second sub-display area AA2 and the third sub-display area AA3 are electrically connected to the same scanning signal lead wire Gy separately through holes H passing through the first passivation layer 102, the second scanning lines GL2 in the first sub-display area AA1, the second sub-display area AA2 and the third sub-display area AA3 are electrically connected to the same scanning signal lead wire Gy separately through holes H passing through the first passivation layer 102, . . . , and the Nth scanning lines GLn in the first sub-display area AA1, the second sub-display area AA2 and the third sub-display area AA3 are electrically connected to the same scanning signal lead wire Gy separately through holes H passing through the first passivation layer 102.

With reference to FIG. 6, in this embodiment, in each sub-display area, a control signal line KL includes a main line Kx extending along the column direction in the non-display area BB and multiple auxiliary lines Ky extending along the row direction and disposed along the column direction. Each auxiliary line Ky is extended from the display area to the non-display area BB and electrically connected to a corresponding main line Kx. Sub-pixels in the same row are electrically connected to the same auxiliary line Ky. Each sub-pixel is electrically connected to the main line Kx through the auxiliary line Ky, and finally electrically connected to a control signal pin K0 in the non-display area. For example, main lines Kx in all control signal lines KL may be formed through the second metal layer M2, i.e., be formed in the same layer as data lines DL. Auxiliary lines Ky in all control signal lines KL may be formed through the first metal layer, i.e., be formed on the same layer as scanning signal lead wires Gy. Each auxiliary line Ky passes through a hole H passing through the second passivation layer 103 and is electrically connected to a corresponding main line Kx.

In this way, the electrical connection of corresponding scanning lines in different sub-display areas can be achieved through the scanning signal lead wires in the display area, so that this method may reduce the number of scanning signal pins and control chips, save costs and optimize the wiring structure, thereby reducing the area of the non-display area and increasing the area ratio of the display area on the array substrate. In this embodiment, main lines in all control signal lines, scanning signal lead wires and data lines pass through the same film layer and are formed in the same manufacture process. Auxiliary lines in all control signal lines and scanning lines pass through the same film layer and are formed in the same manufacture process, which does not increase the number of masks and further saves costs.

Figure 7:
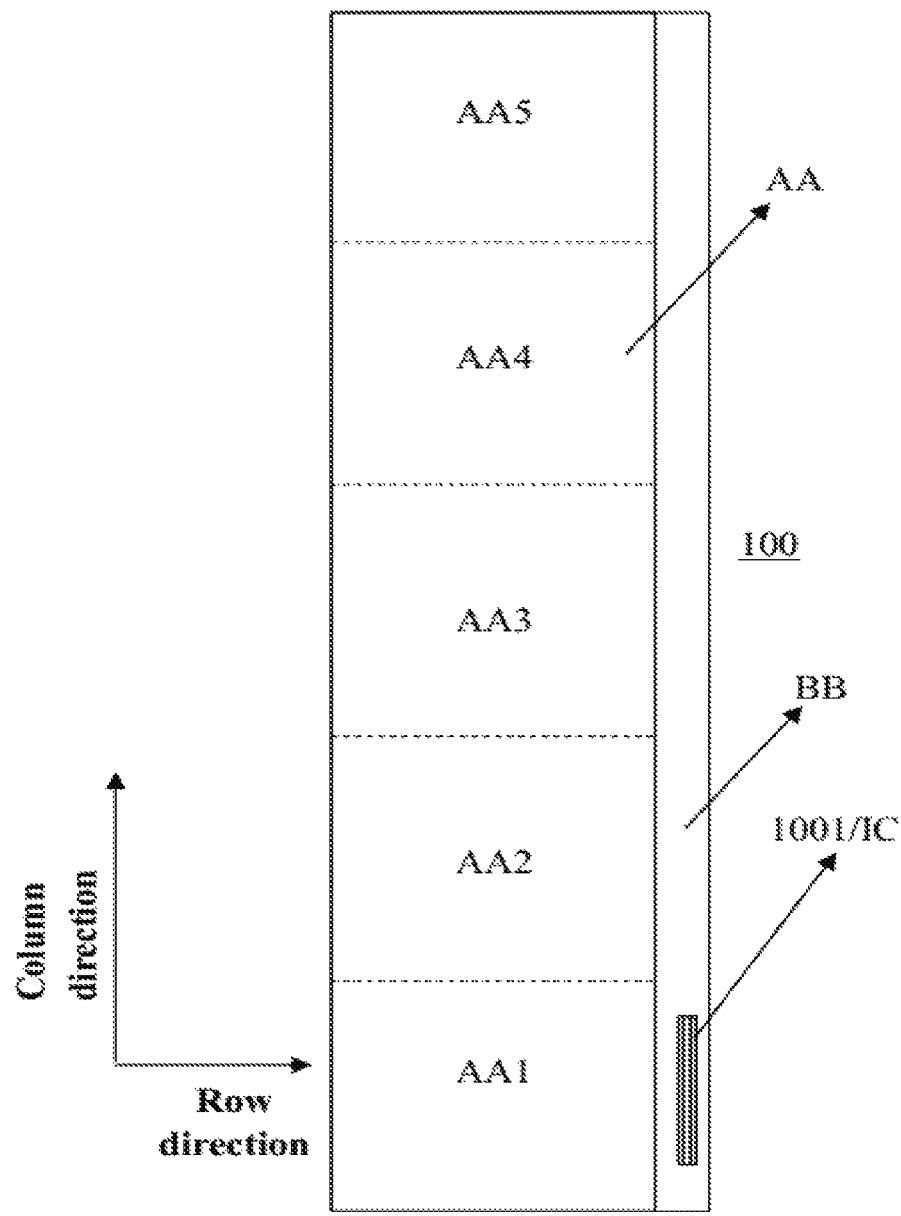
FIG. 7 is a structural diagram of another array substrate according to an embodiment of the present disclosure.

FIG. 7 is a structural diagram of another array substrate according to an embodiment of the present disclosure. In this embodiment, the array substrate 100 includes a display area AA and at least a non-display area BB disposed on one side of the display area AA. The display area AA includes multiple sub-display areas disposed along the column direction (a first sub-display area AA1, a second sub-display area AA2, a third sub-display area AA3, a fourth sub-display area AA4 and a fifth sub-display area AA5). Each sub-display area (AA1, AA2, AA3, AA4 and AA5) can be individually controlled.

The array substrate 100 further includes a bonding area 1001, and the bonding area 1001 is disposed merely in part of the non-display area, corresponding to one side of one sub-display area (for example, the first sub-display area AA1), of the array substrate 100. Data signal pins, scanning signal pins and control signal pins are disposed in the bonding area 1001 of the array substrate. Data lines, scanning lines, control signal lines in all sub-display areas are electrically connected to corresponding pins in the bonding area 1001. The array substrate 100 can further and merely include one control chip IC which is bound in the bonding area 1001 of the array substrate. The data signal pins, scanning signal pins and control signal pins are electrically connected to corresponding drive pins on the control chip IC. The array substrate, for example, further includes a flexible circuit board, and drive pins on the control chip IC are electrically connected to an external drive circuit through traces on the flexible circuit board.

Figure 8:
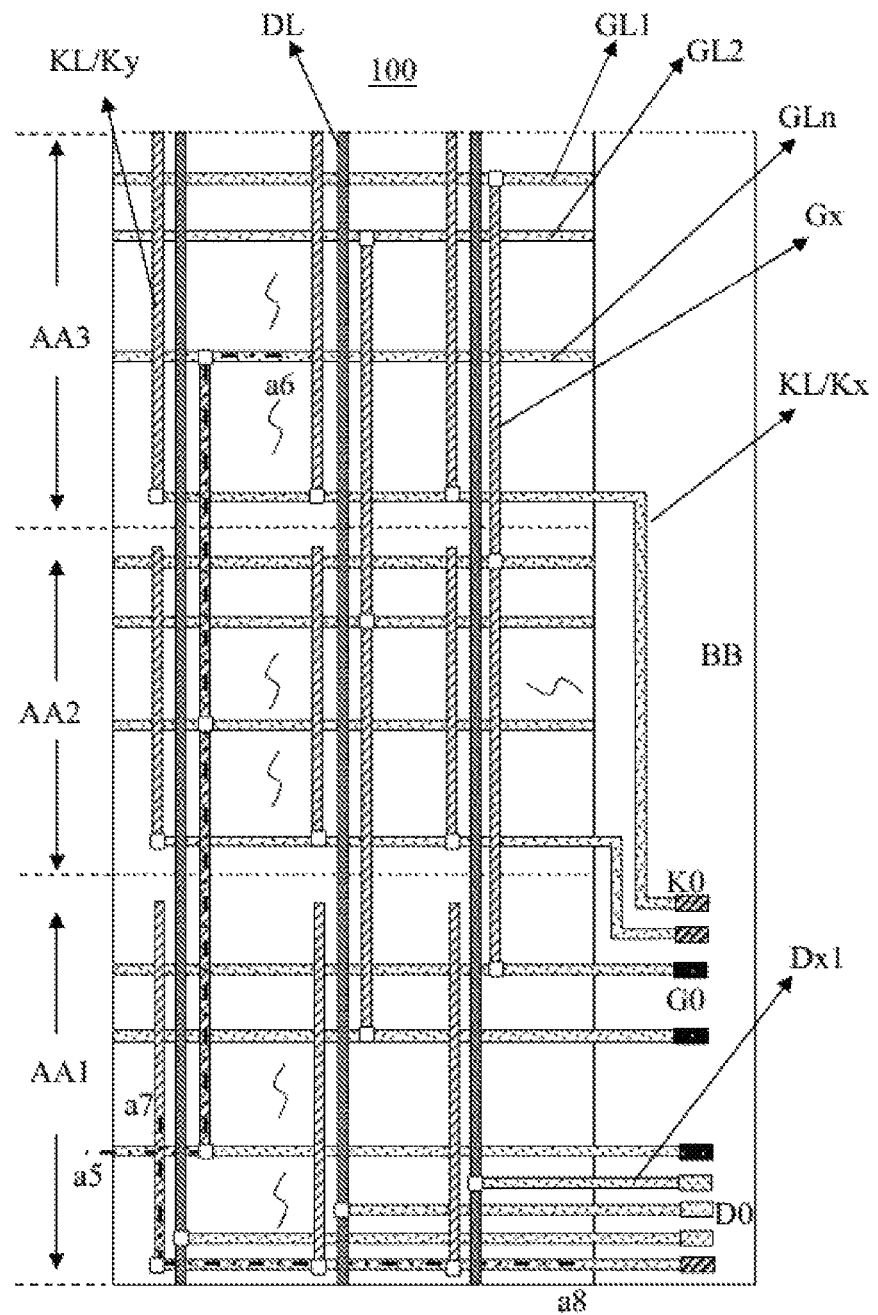
FIG. 8 is a schematic diagram of a wiring method of the array substrate illustrated in FIG. 7.
Figure 9:
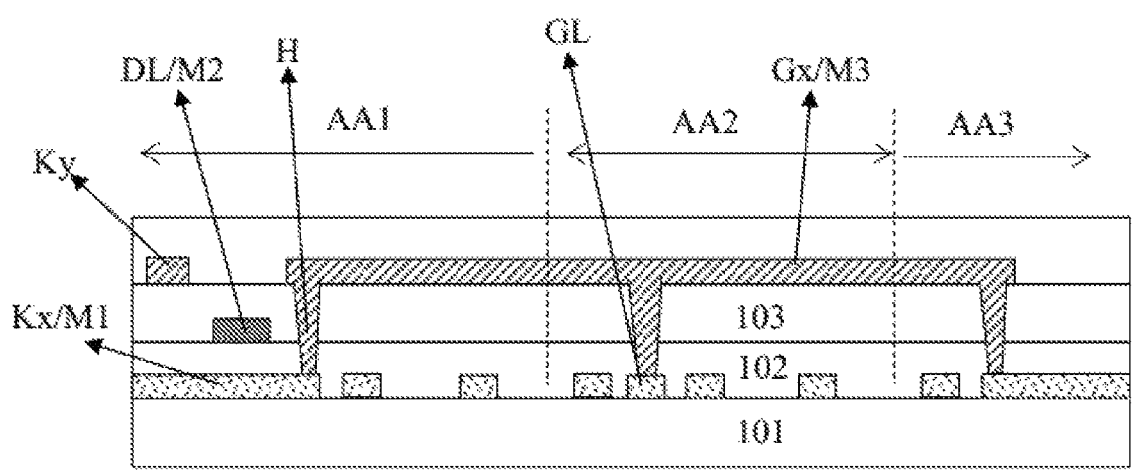
FIG. 9 is a sectional view taken along a line a5-a6 of FIG. 8.
Figure 10:
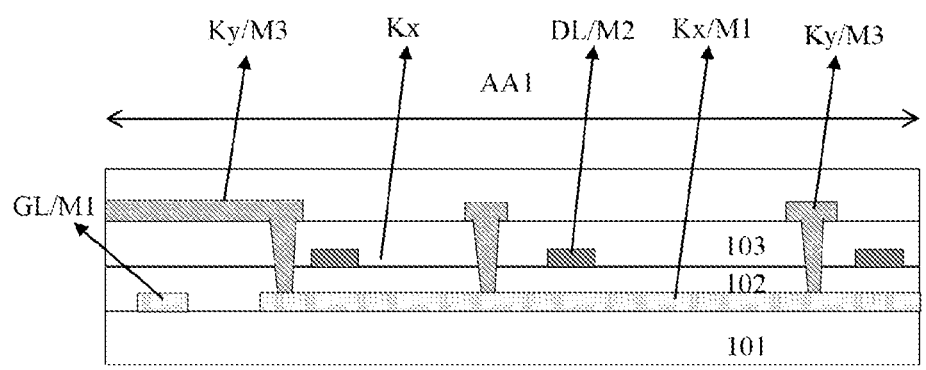
FIG. 10 is a sectional view taken along a line a7-a8 of FIG. 8.

FIG. 8 is a schematic diagram of a wiring method of the array substrate illustrated in FIG. 7, FIG. 9 is a sectional view taken along an a5-a6 direction of FIG. 8, and FIG. 10 is a sectional view taken along an a7-a8 direction of FIG. 8. In this embodiment, the array substrate 100 includes at least a first sub-display area AA1, a second sub-display area AA2 and a third sub-display area AA3. Multiple sub-display areas (AA1, AA2, AA3 and . . . ) are disposed along the column direction. A plurality of data lines DL sequentially pass through the first sub-display area AA1, the second sub-display area AA2 and the third sub-display area AA3 separately. Sub-pixels in the same column are electrically connected to the same data line DL. A plurality of scanning lines GL are disposed in each sub-display area (AA1, AA2, AA3 and . . . ). In each sub-display area, the plurality of scanning lines GL are extended along the row direction and disposed along the column direction. In each sub-display area, sub-pixels in the same row are electrically connected to the same scanning line GL. The array substrate 100 further includes at least two control signal lines KL. All sub-pixels in each sub-display area (AA1, AA2, AA3 and . . . ) are electrically connected to the same control signal line KL. Sub-pixels in different sub-display areas (AA1, AA2, AA3 and . . . ) are electrically connected to different control signal lines KL.

In this embodiment, the array substrate 100 further includes a plurality of connection lines Gx disposed in the display area. Corresponding scanning lines GL in different sub-display areas are electrically connected to each other through connection lines Gx.

Specifically, the array substrate 100 can include a first metal layer M1, a second metal layer M2 and a third metal layer M3, which are sequentially stacked. A plurality of scanning lines GL are formed in the first metal layer M1, multiple data lines DL are formed in the second metal layer M2 and multiple connection lines Gx are formed in the third metal layer M3.

With reference to FIGS. 7, 8, 9 and 10, in this embodiment, the array substrate 100 includes: a substrate 101, a first metal layer M1, a first passivation layer 102, a second metal layer M2, a second passivation layer 103, and a third metal layer M3. The first metal layer M1 is disposed on the substrate 101 and includes a plurality of scanning lines GL electrically insulated from each other, the plurality of scanning lines GL are extended along the row direction and disposed along the column direction. In the manufacturing process, for example, scanning lines GL may be formed by patterning of the first metal layer M1. The first passivation layer 102 is disposed on the substrate 101 and the first metal layer M1 is covered by the first passivation layer 102. The second metal layer M2 is disposed in the first passivation layer 102. The second metal layer M2 and the first metal layer M1 are stacked and insulated from each other through the first passivation layer 102. The second metal layer M2 includes a plurality of data lines DL electrically insulated from each other, and the plurality of data lines DL are extended along the column direction and disposed along the row direction. The second passivation layer 103 is disposed on the first passivation layer 102 and the second metal layer M2 is covered by the second passivation layer 103. The third metal layer M3 is disposed on the second passivation layer 103. The third metal layer M3 and the metal layer M2 are stacked and insulated through the second passivation layer 103. The third metal layer M3 includes a plurality of connection lines Gx electrically insulated from each other, and the plurality of scanning lines GL are electrically connected to corresponding connection lines Gx through holes H sequentially passing through the first passivation layer 102 and the second passivation layer 103 separately. For example, first scanning lines GL1 in the first sub-display area AA1, the second sub-display area AA2 and the third sub-display area AA3 are electrically connected to the same connection line Gx through holes H sequentially passing through the first passivation layer 102 and the second passivation layer 103 separately, second scanning lines GL2 in the first sub-display area AA1, the second sub-display area AA2 and the third sub-display area AA3 are electrically connected to the same connection line Gx through holes H sequentially passing through the first passivation layer 102 and the second passivation layer 103 separately, . . . , and Nth scanning lines GLn in the first sub-display area AA1, the second sub-display area AA2 and the third sub-display area AA3 are electrically connected to the same connection line Gx through holes H sequentially passing through the first passivation layer 102 and the second passivation layer 103 separately, where N is an integer greater than or equal to 3.

In this embodiment, each control signal line KL includes a main line Kx and multiple auxiliary lines Ky extending along the column direction and disposed along the row direction. In each sub-display area, sub-pixels in the same column are electrically connected to the same auxiliary line Ky. Each sub-pixel is electrically connected to the same main line Kx through auxiliary lines Ky, and finally electrically connected to a control signal pin in the non-display area. The main line Kx in each control signal line KL is extended from the display area to the non-display area BB. For example, main lines Kx in all control signal lines KL can be formed by the first metal layer M1, i.e., be formed on the same layer as scanning lines GL. Auxiliary lines Ky in all control signal lines KL can be formed by the third metal layer M3, i.e., be formed on the same layer as connection lines Gx. Each auxiliary line Ky is electrically connected to a corresponding main line Kx through the holes H sequentially passing through the first passivation layer 102 and the second passivation layer 103.

Specifically, control signal pins are all disposed in the bonding area 1001. Main lines Kx in control signal lines KL corresponding to the sub-display area (for example, the first sub-display area AA1) are extended along the row direction to the non-display area BB, and are electrically connected to the corresponding control signal pin in the non-display area. Main lines Kx in control signal lines KL corresponding to other sub-display areas (for example, the second sub-display area AA2, the third sub-display area AA3 and . . . ) on the array substrate are extended along the row direction to the non-display area BB, then change direction in the non-display area BB, extended to the bonding area 1001 and electrically connected to corresponding control signal pins disposed in the bonding area.

In this embodiment, the array substrate 100 further includes multiple data signal lead wires Dx1 extending along the row direction and disposed along the column direction. Each data signal lead Dx1 is electrically connected to a respective data line DL correspondingly. A plurality of data lines DL are electrically connected to data signal pins in the non-display area BB through the multiple data signal lead wires Dx1. For example, all data signal lead wires Dx1 may be formed by the first metal layer M1, i.e., be formed in the same layer as scanning lines GL. Each data line DL is electrically connected to a corresponding data signal lead Dx1 through via holes passing through the first passivation layer separately. Specifically, data signal pins are all disposed in the bonding area 1001, and multiple data signal lead wires Dx1 are extended from the sub-display area (for example, the first sub-display area AA1) to the non-display area BB and electrically connected to corresponding data signal pins.

In this embodiment, the array substrate also can include a first metal layer and a second metal layer which are sequentially stacked. A plurality of scanning lines are disposed in the first metal layer, a plurality of data lines are disposed in the second metal layer and a plurality of connection lines are disposed in the second metal layer.

Therefore, all data signal pins, control signal pins and scanning signal pins may be disposed in the same bonding area to achieve the purpose of driving the entire array substrate through a few or a single control chip and/or flexible circuit board, thereby saving costs and increasing the area ratio of the display area. In this embodiment, a plurality of scanning lines are electrically connected to each other through a plurality of connection lines in the display area, thereby reducing the area of the non-display area and increasing the area ratio of the display area. In this embodiment, main lines in a plurality of scanning lines and a plurality of control signal lines are formed in the same layer as multiple data signal lead wires and made from the same material as multiple data signal lead wires. Auxiliary lines in the multiple control signal lines are formed on the same layer as multiple connection lines and made from the same material as multiple connection lines. Therefore, the number of patterned metal layers and manufacturing processes is reduced, saving costs.

Figure 11:
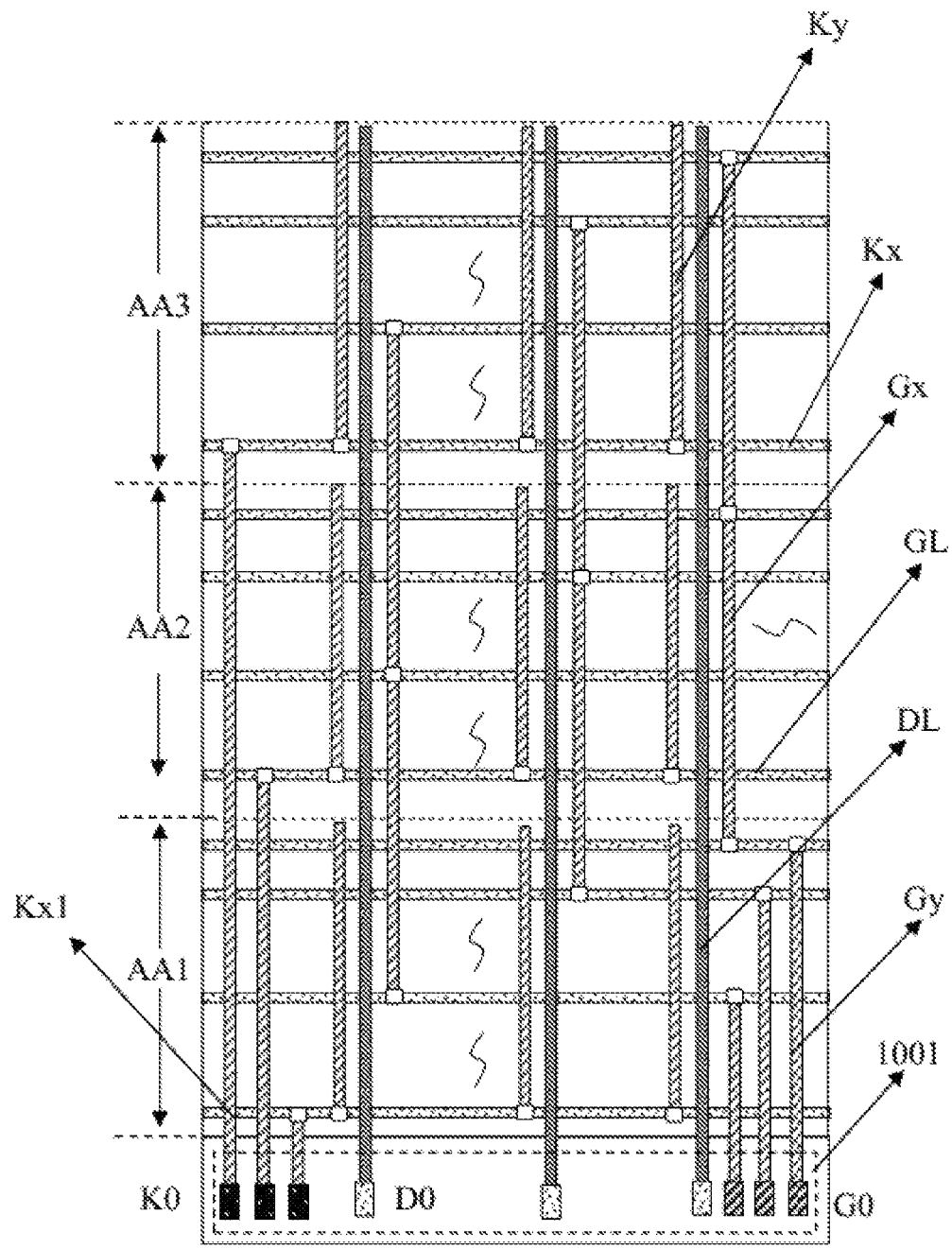
FIG. 11 is a structural diagram of another array substrate according to an embodiment of the present disclosure.

FIG. 11 is a structural diagram of another array substrate according to an embodiment of the present disclosure. The array substrate according to an embodiment of the present disclosure may also have the structure illustrated in FIG. 11. In this embodiment, the array substrate is similar to the array substrate illustrated in FIGS. 7, 8, 9 and 10. A plurality of data lines DL sequentially pass through multiple sub-display areas separately, corresponding scanning lines GL in different sub-display areas are electrically connected to each other through connection lines Gx in the display area, and each control signal line KL includes a main Kx and multiple auxiliary lines Ky extending along the column direction and disposed along the row direction. Scanning lines GL and mains line Kx in control signal lines KL are formed in the first metal layer M1, data lines DL are formed in the second metal layer M2, connection lines Gx and auxiliary lines Ky in control signal lines KL are formed in the third metal layer M3.

The difference is that the bonding area 1001 is merely disposed in the non-display area BB on one end in the column direction of the array substrate 100. For example, the bonding area 100 is disposed in a part of the non-display area close to one end of the first sub-display area AA1 of the array substrate. Data signal pins D0, scanning signal pins G0 and control signal pins K0 are disposed in the bonding area 1001 of the array substrate. Scanning lines, data lines and control signal lines are electrically connected to corresponding pins in the bonding area 1001. Specifically, a plurality of data lines DL are extended along the column direction to the bonding area 1001 and electrically connected to data signal pins D0 in the bonding area. The array substrate 100 further includes multiple scanning signal lead wires Gy extending along the column direction and disposed along the row direction. Each of the plurality of scanning lines GL in one sub-display area (for example, the first sub-display area) close to the bonding area 1001 is electrically connected to each one of multiple scanning signal lead wires Gx1 correspondingly, and is electrically connected to the scanning signal pin G0 in the bonding area 1001 through the corresponding scanning signal lead wire Gy. The array substrate 100 further includes multiple control signal lead wires Kx1 extending along the column direction and disposed along the row direction. Multiple control signal lead wires Kx1 are extended from the display area to the bonding area 1001 and electrically connected to control signal pins in the bonding area. Each control signal line KL is electrically connected to a respective control signal lead Kx1 correspondingly, and is electrically connected to a control signal pin K0 in the bonding area 1001 through multiple control signal lead wires Kx1.

Multiple control signal lead wires Kx1 and multiple scanning signal lead wires Gy are formed in the third metal layer. The wiring on the third metal layer can lead scanning lines and control signal lines to one end of the array substrate, overcoming the problem in which the overpass design is required when different lines are intersected. When the control chip and the flexible circuit board are employed, only a small number of control chips and flexible circuit boards, or even only one control chip and one flexible circuit board, may drive multiple sub-display areas to display pictures. Compared with the related art in which multiple control chips and multiple flexible circuit boards are required, this method may reduce the number of control chips and flexible circuit boards, thereby saving costs.

Figure 12:
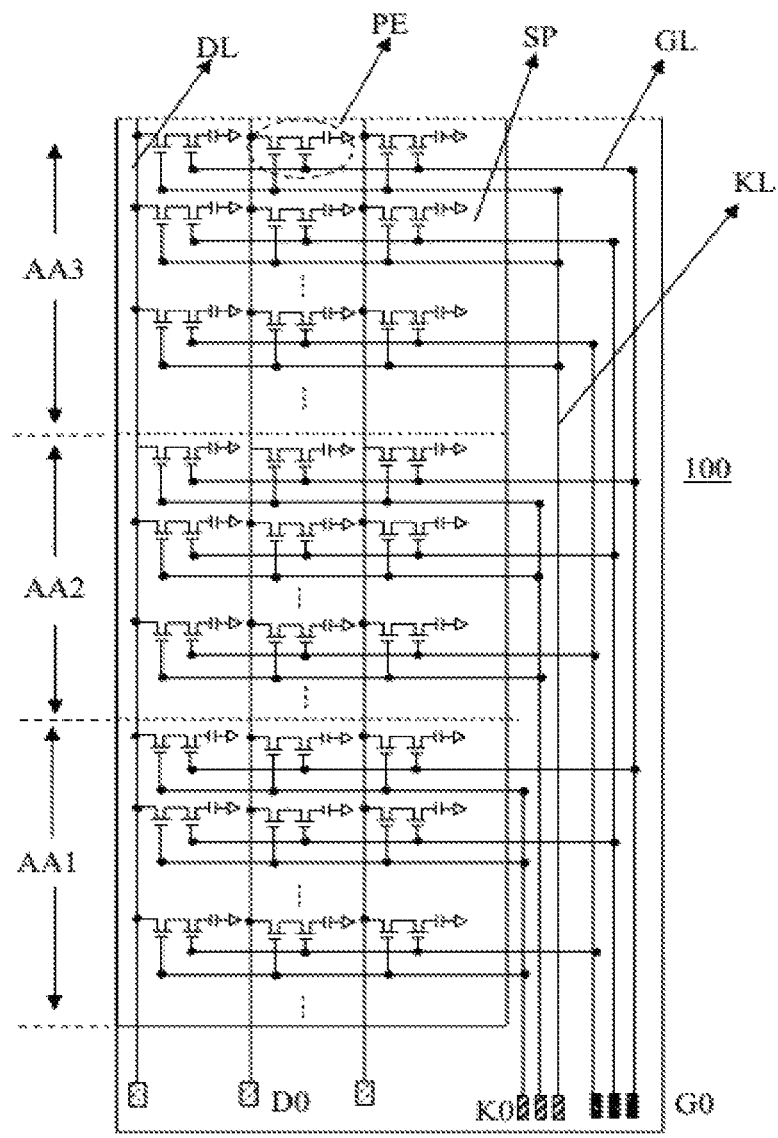
FIG. 12 is a structural diagram of another array substrate according to an embodiment of the present disclosure.
Figure 13:
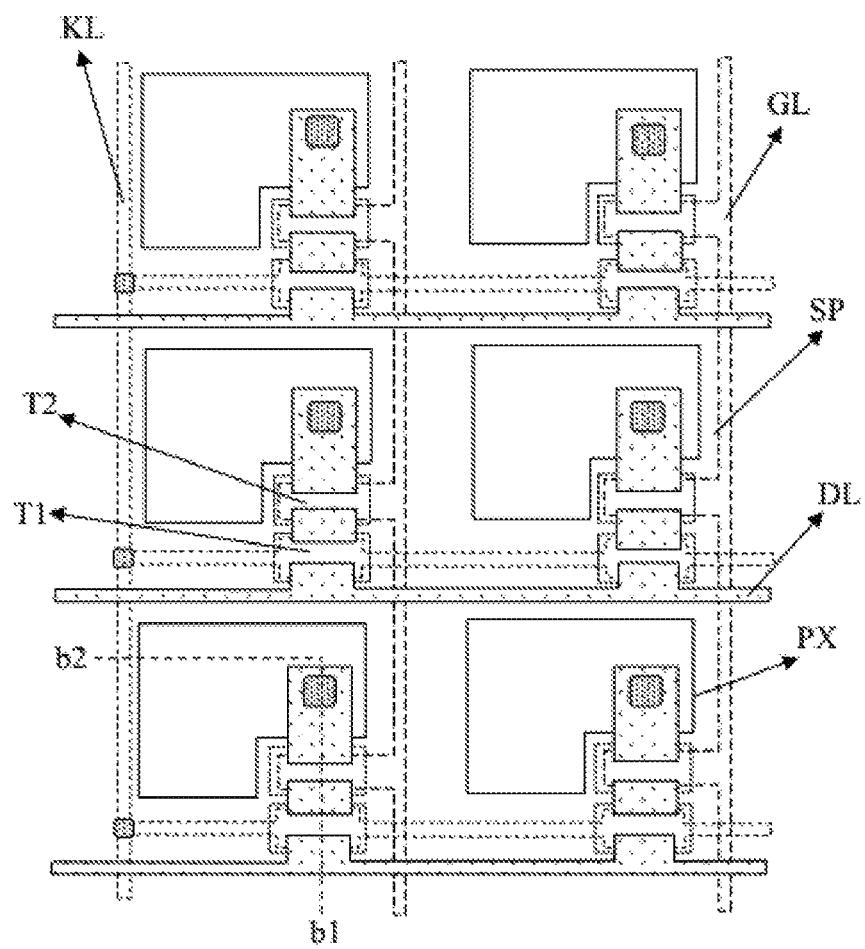
FIG. 13 is a structural diagram of pixels of the array substrate illustrated in FIG. 12.
Figure 14:
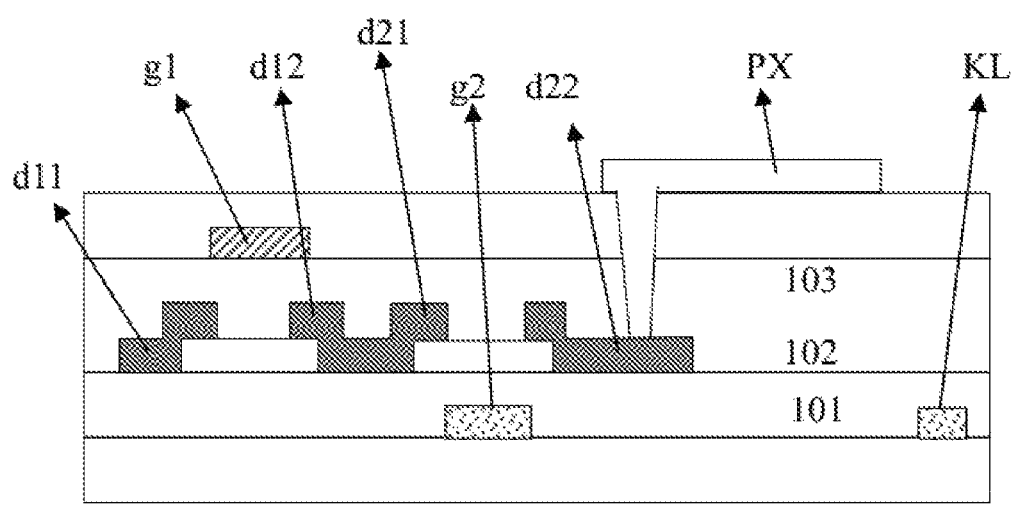
FIG. 14 is a sectional view taken along a line b1-b2 of FIG. 13.

FIG. 12 is a structural diagram of another array substrate according to an embodiment of the present disclosure. FIG. 13 is a structural diagram of pixels of the array substrate illustrated in FIG. 12. FIG. 14 is a sectional view taken along a line b1-b2 of FIG. 13. In this embodiment, a pixel drive module PE is disposed in each sub-pixel SP. Each pixel drive module PE includes a first transistor T1 and a second transistor T2, where a first electrode d11 of the first transistor T1 is electrically connected to a data signal input terminal of the pixel drive module PE, a second electrode d22 of the second transistor T2 is electrically connected to a data signal output terminal of the pixel drive module PE, a control terminal g1 of the first transistor T1 is electrically connected to a control signal input terminal of the pixel drive module PE, and a control terminal g2 of the second transistor T2 is electrically connected to a scanning signal input terminal of the pixel drive module PE.

Furthermore, in this embodiment, the first electrode d11 of the first transistor T1 is electrically connected to a corresponding data line DL, a second electrode d12 of the first transistor T1 is electrically connected to a first electrode d21 of the second transistor T2, and the second electrode d22 of the second transistor T2 is electrically connected to a pixel electrode PX.

The control terminal g1 of the first transistor T1 is electrically connected to a corresponding control signal line KL, the control terminal g2 of the second transistor T2 is electrically connected to a corresponding scanning line GL. Optionally, the control terminal g1 of the first transistor T1 is electrically connected to a corresponding scanning line GL, and the control terminal g2 of the second transistor T2 is electrically connected to a corresponding control signal line KL. When one sub-display area needs to display pictures, or one sub-display area needs to update displayed pictures, control signal lines KL electrically connected to the sub-display is turned on, all pixel drive modules PE in the sub-display are in a conducting state, multiple scanning lines GL sequentially scan all sub-pixels PE in the sub-display area row by row, and multiple data lines DL in the sub-display area provide data signals for corresponding pixel electrodes PE in sub-pixels PE, so that the sub-display area may display pictures or update displayed pictures, thereby achieving the individual control of each sub-display area.

In this embodiment, since the array substrate includes multiple sub-display areas which can be controlled separately, the array substrate has a high frame refresh frequency. For example, the first transistor T1 and the second transistor T2 can be low-temperature polycrystalline silicon thin-film transistors. The low-temperature polycrystalline silicon thin-film transistor has high electron mobility, and the charging rate of each sub-pixel may be ensured, thereby better meeting picture refreshing requirements of the oblong array substrate.

Figure 15:
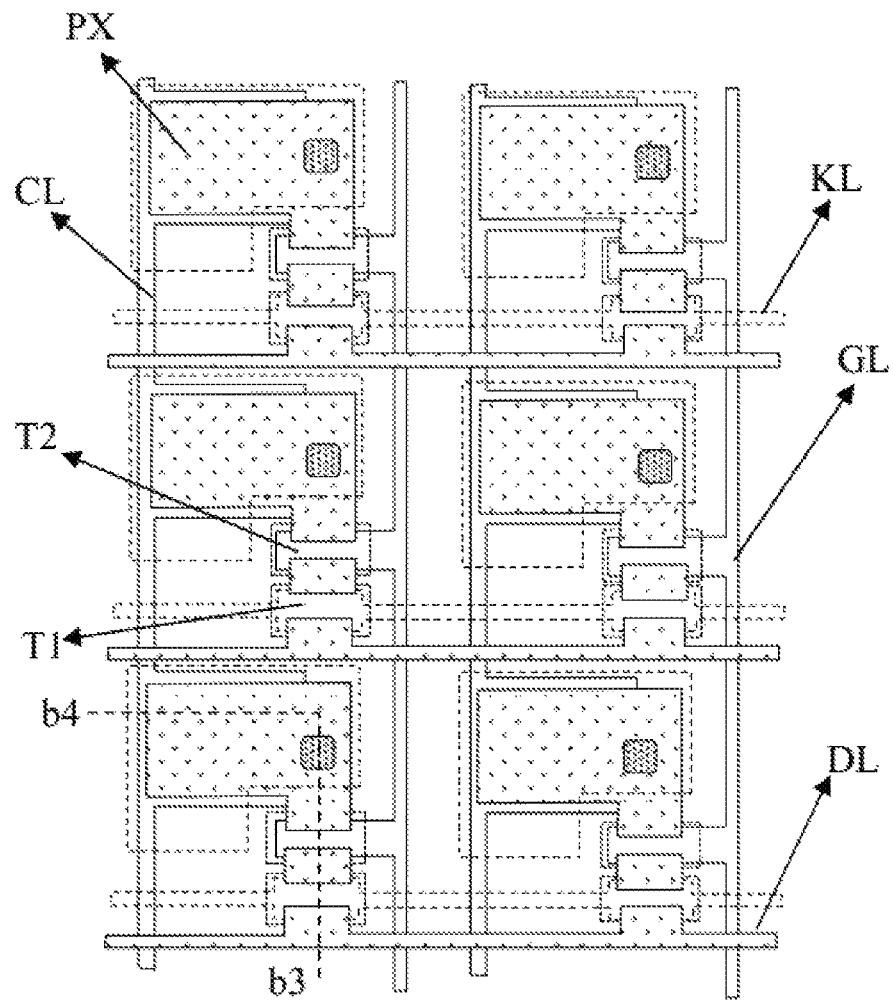
FIG. 15 is a structural diagram of another pixel of the array substrate illustrated in FIG. 12.
Figure 16:
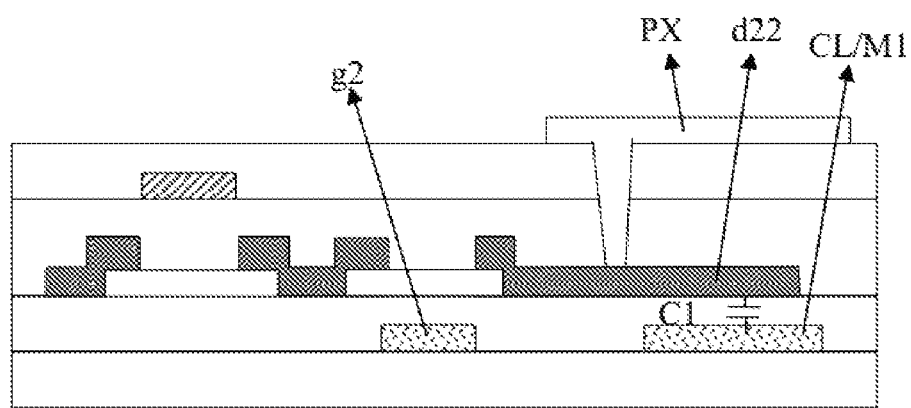
FIG. 16 is a sectional view taken along a line b3-b4 of FIG. 15.

FIG. 15 is a structural diagram of another pixel of the array substrate illustrated in FIG. 12, and FIG. 16 is a sectional view taken along a line b3-b4 of FIG. 15. The pixel structure of the array substrate provided by this embodiment is similar to the pixel structure of the array substrate illustrated in FIGS. 12, 13 and 14. The difference is that the array substrate further includes storage voltage signal lines CL. Storage voltage signal lines CL may be formed in the same layer as scanning lines GL, for example, be formed by patterning of the first metal layer, and have overlapping regions with the second electrode d22 of the second transistor T2. When the storage voltage signal line CL is provided with one common voltage signal, and the second electrode d22 of the second transistor T2 is provided with one data signal, a storage capacitor C1 is formed between the storage voltage signal line CL and the second electrode d22 of the second transistor T2. The storage capacitor C1 can increase the charge storage capacity of the pixel capacitance of sub-pixels where the storage capacitor C1 is located and improve the drive capacity of the sub-pixels.

Figure 17:
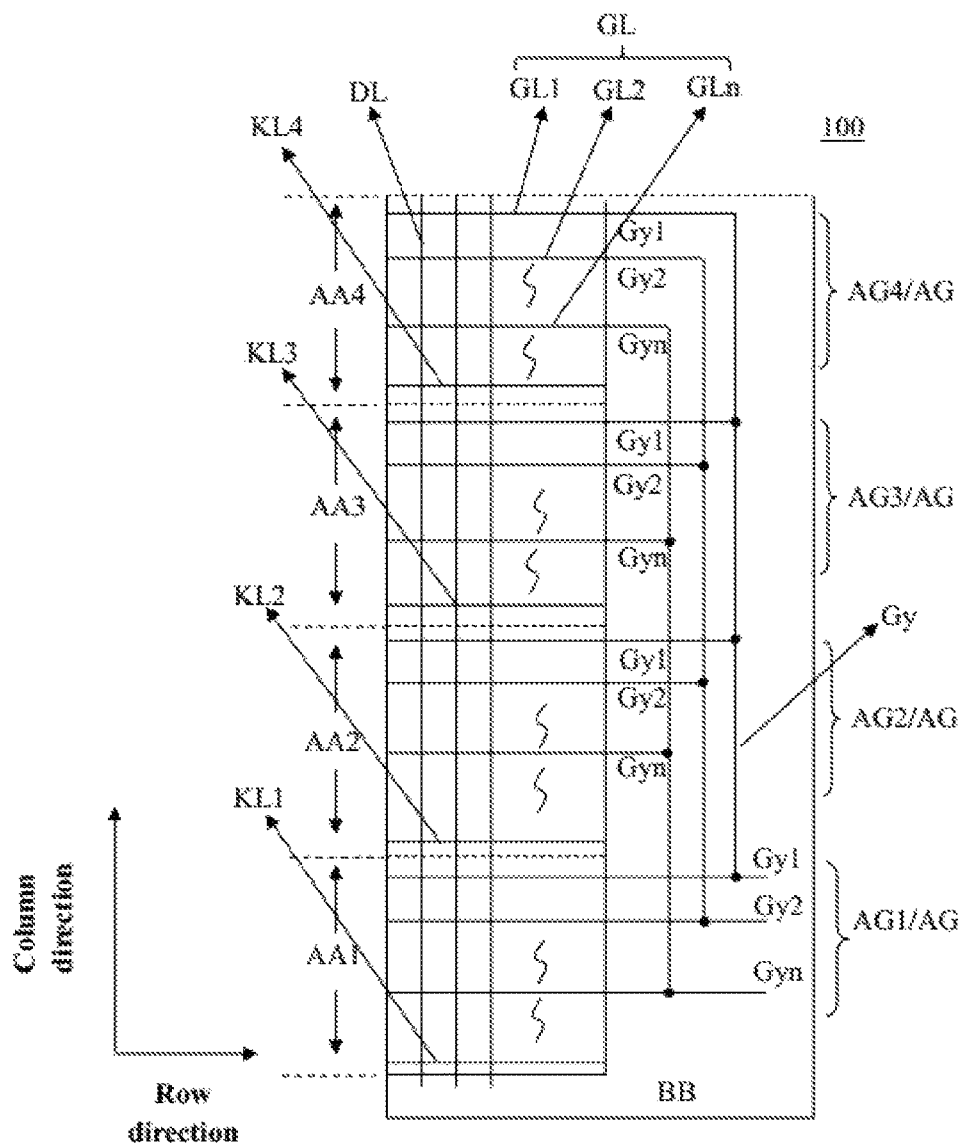
FIG. 17 is a structural diagram of another array substrate according to an embodiment of the present disclosure.

FIG. 17 is a structural diagram of another array substrate according to an embodiment of the present disclosure. The array substrate 100 in FIG. 17 includes at least a first sub-display area AA1, a second sub-display area AA2, a third sub-display area AA3 and a fourth sub-display area AA4. Multiple sub-display areas (AA1, AA2, AA3, AA4 and . . . ) are disposed along the column direction and form a strip-shaped array substrate extending along the column direction.

The array substrate 100 further includes a plurality of data lines DL. The plurality of data lines DL sequentially pass through the first sub-display area AA1, the second sub-display area AA2, the third sub-display area AA3 and the fourth sub-display area AA4 separately. Sub-pixels in the same column are electrically connected to the same data line DL. Each sub-display area (AA1, AA2, AA3, AA4 and . . . ) includes a plurality of scanning lines GL. In each sub-display area, the plurality of scanning lines GL are extended along the row direction and disposed along the column direction. In each sub-display area (AA1, AA2, AA3, AA4 and . . . ), sub-pixels in the same row are electrically connected to the same scanning line GL. The array substrate includes at least two control signal lines KL. All sub-pixels in each sub-display area (AA1, AA2, AA3, AA4 and . . . ) are electrically connected to the same control signal line KL, and sub-pixels in different sub-display areas (AA1, AA2, AA3 and . . . ) are electrically connected to different control signal lines KL.

In this embodiment, the array substrate 100 further includes multiple groups of scanning signal lead wires AG which are disposed in a non-display area BB. Each group of scanning signal lead wires AG corresponds to a respective one sub-display area. Each group of scanning signal lead wires AG includes multiple scanning signal lead wires Gy, each of which is electrically connected to a respective one scanning line GL in each sub-display area (AA1, AA2, AA3, AA4 and . . . ) correspondingly. The plurality of scanning lines GL in each sub-display area are electrically connected to scanning signal pins in the non-display area BB through multiple corresponding scanning signal lead wires Gy.

Specifically, for example, the array substrate 100 includes the first sub-display area AA1, the second sub-display area AA2, the third sub-display area AA3 and the fourth sub-display area AA4 which are disposed along the column direction. Multiple groups of scanning signal lead wires AG include a first group of scanning signal lead wires AG1, a second group of scanning signal lead wires AG2, a third group of scanning signal lead wires AG3 and a fourth group of scanning signal lead wires AG4. Each of multiple scanning signal lead wires Gy in the first group of scanning signal lead wires AG1 is electrically connected to a respective one of multiple scanning lines GL in the first sub-display area AA1 correspondingly, each of multiple scanning signal lead wires Gy in the second group of scanning signal lead wires AG2 is electrically connected to a respective one of multiple scanning lines GL in the second sub-display area AA2 correspondingly, each of multiple scanning signal lead wires Gy in the third group of scanning signal lead wires AG3 is electrically connected to a respective one of multiple scanning lines GL in the third sub-display area AA3 correspondingly, and each of multiple scanning signal lead wires Gy in the fourth group of scanning signal lead wires AG4 is electrically connected to a respective one of multiple scanning lines GL in the fourth sub-display area AA4 correspondingly.

Taking the first sub-display area AA1 and the second sub-display area AA2 as an example, the first sub-display area AA1 and the second sub-display area AA2 are disposed adjacently. Each of multiple scanning signal lead wires Gy in the second group of scanning signal lead wires AG2 is electrically connected to a respective one of multiple scanning signal lead wires Gy in the first group of multiple scanning signal lead wires AG1 correspondingly. Specifically, a first scanning signal lead Gy1, a second scanning signal lead Gy2, . . . , and an Nth scanning signal lead Gyn in the second group of scanning signal lead wires AG2 are electrically connected to a first scanning signal lead Gy1, a second scanning signal lead Gy2, . . . , and an Nth scanning signal lead Gyn in the first group of scanning signal lead wires AG1 respectively, where N is a positive integer greater than or equal to 3.

Furthermore, the third sub-display area AA3 and the second sub-display area AA2 are disposed adjacent to each other. Each of multiple scanning signal lead wires Gy in the third group of scanning signal lead wires AG3 is electrically connected to a respective one of multiple scanning signal lead wires Gy in the second group of multiple scanning signal lead wires AG2 correspondingly. For example, a first scanning signal lead Gy1, a second scanning signal lead Gy2, . . . , and an Nth scanning signal lead Gyn in the third group of scanning signal lead wires AG3 are electrically connected to the first scanning signal lead Gy1, the second scanning signal lead Gy2, . . . , and the Nth scanning signal lead Gyn in the second group of scanning signal lead wires AG2 respectively, where N is an integer greater than or equal to 3.

In this way, multiple scanning lines GL in the second sub-display area AA2, the third sub-display area AA3, the fourth sub-display area AA4 and so on are electrically connected to scanning signal pins through multiple scanning signal lead wires Gy in the first group of scanning signal lead wires AG1. Therefore, multiple scanning lines GL in multiple sub-display areas (AA1, AA2, AA3, AA4 and . . . ) share scanning signal pins, thereby reducing the number of scanning signal pins. At the same time, even if corresponding scanning lines in different sub-display areas share the same scanning signal pin, the separate control of different sub-display areas may also be achieved by controlling the display and turning off of each sub-display area through control signal lines. When the control chip and the flexible circuit board are employed, only a small number of control chips and flexible circuit boards, or even only one control chip and one flexible circuit board, can drive multiple sub-display areas to display information. Compared with the related art in which multiple control chips and multiple flexible circuit boards are required, this method may reduce the number of control chips and flexible circuit boards, thereby saving costs.

Figure 18:
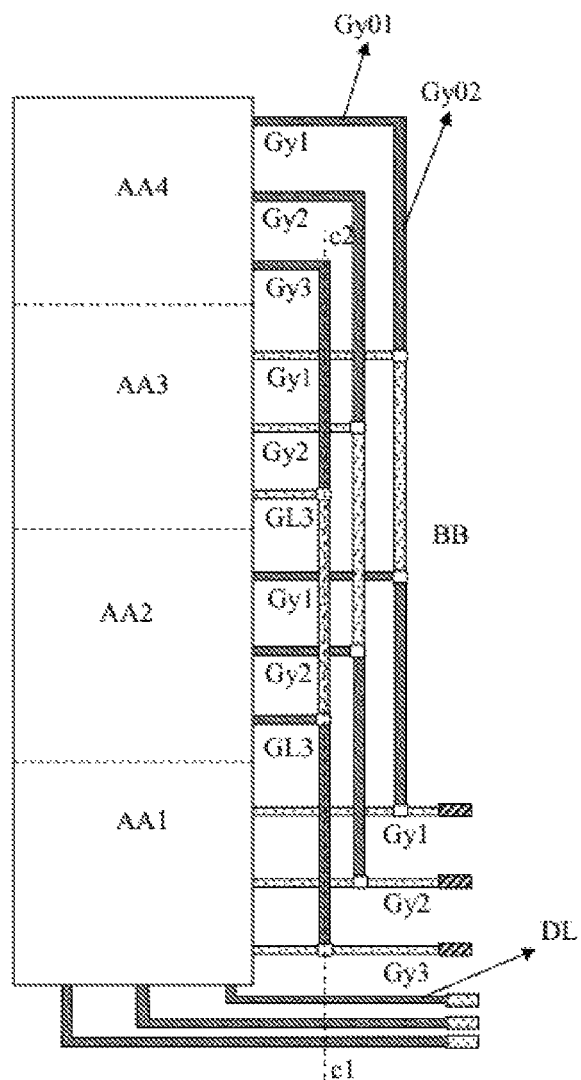
FIG. 18 is a structural diagram of wiring films of the array substrate illustrated in FIG. 17.
Figure 19:
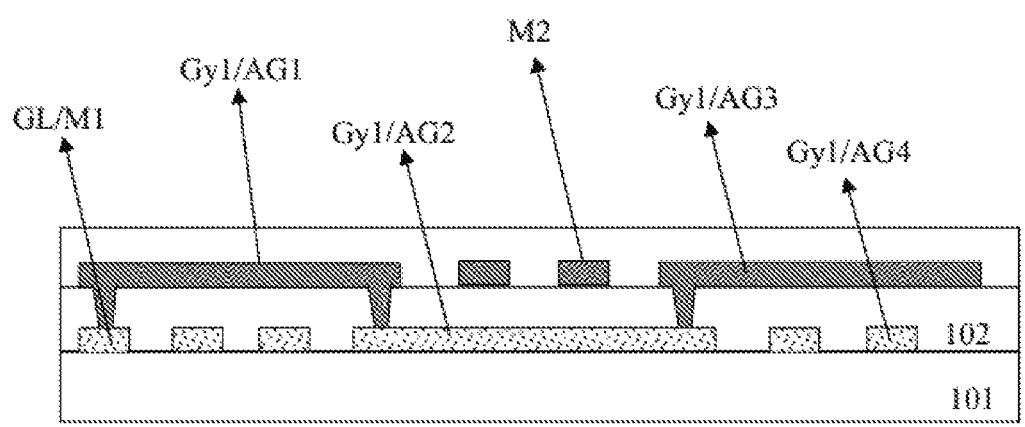
FIG. 19 is a sectional view taken along a line c1-c2 of FIG. 18.

FIG. 18 is a structural diagram of wiring films of the array substrate illustrated in FIG. 17, and FIG. 19 is a sectional view taken along a line c1-c2 of FIG. 18. With reference to FIGS. 17, 18 and 19, in this embodiment, different scanning signal lead wires Gy which are connected to adjacent sub-display areas (AA1, AA2, AA3, AA4 and . . . ) are disposed in different film layers. For example, the first group of scanning signal lead wires AG1 and the second group of scanning signal lead wires AG2 are disposed in different films, the second group of scanning signal lead wires AG2 and the third group of scanning signal lead wires AG3 are disposed in different films, and the third group of scanning signal lead wires AG3 and the fourth group of scanning signal lead wires AG4 are disposed in different films.

In this embodiment, the array substrate 100 includes: a substrate 101, a first metal layer M1, a first passivation layer 102, and a second metal layer M2. The first metal layer M1 is disposed on the substrate 101 and includes a plurality of scanning lines GL which are electrically insulated from each other. The first passivation layer 102 is disposed on the substrate 101 and first metal layer M1 is covered by the first passivation layer 102. The second metal layer M2 is disposed on the first passivation layer 102. The second metal layer M2 and the first metal layer M1 are stacked and insulated from each other through the first passivation layer 102. The second metal layer M2 includes a plurality of data lines DL electrically insulated from each other.

In this embodiment, the second group of scanning signal lead wires AG2 are formed in the second metal layer M2, i.e., the second group of scanning signal lead wires AG2 and the plurality of data lines DL are formed by patterning of the second metal layer M2. The first group of scanning signal lead wires AG1 are formed in the first metal layer M1, i.e., the first group of scanning signal lead wires AG1 and the plurality of scanning lines GL are formed by patterning of the first metal layer M1. Each scanning signal lead wire Gy in the second group of scanning signal lead wires AG2 is electrically connected to the corresponding scanning line GL through a hole passing through the first passivation layer 102. Each scanning signal lead wire Gy in the second group of scanning signal lead wires AG2 is electrically connected to a respective scanning signal lead wire Gy in the first group of scanning signal lead wires AG1 through a hole passing through the second passivation layer 102. Alternatively, the first group of scanning signal lead wires AG1 are formed in the second metal layer M2 and the second group of scanning signal lead wires AG2 are formed in the first metal layer M1.

In this embodiment, the second group of scanning signal lead wires AG2 are formed in the second metal layer M2. Each of multiple scanning signal lead wires Gy in the second group of scanning signal lead wires AG2 is electrically connected to a respective one of scanning lines GL correspondingly through a via hole passing through the first passivation layer 102. The third group of scanning signal lead wires AG3 are formed in the first metal layer M1. Each of multiple scanning signal lead wires Gy in the third group of scanning signal lead wires AG3 is electrically connected to a respective one of multiple scanning signal lead wires Gy in the second group of scanning signal lead wires AG2 correspondingly through a via hole passing through the first passivation layer 102s. Alternatively, the second group of scanning signal lead wires AG2 are formed on the first metal layer M1 and the third group of scanning signal lead wires AG3 are formed on the second metal layer M2.

In this embodiment, the fourth group of scanning signal lead wires AG4 are formed in the second metal layer M2. Each of multiple scanning signal lead wires Gy in the fourth group of scanning signal lead wires AG4 is electrically connected to the a respective one of scanning lines GL correspondingly through a hole passing through the first passivation layer 102. The third group of scanning signal lead wires AG3 is formed in the first metal layer M1. Each of multiple scanning signal lead wires Gy in the fourth group of scanning signal lead wires AG4 is electrically connected to a respective one of scanning signal lead wires Gy in the third group of scanning signal lead wires AG3 correspondingly through a hole passing through the first passivation layer 102. Alternatively, the fourth group of scanning signal lead wires AG4 is formed in the first metal layer M1 and the third group of scanning signal lead wires AG3 is formed in the second metal layer M2.

In this embodiment, a plurality of scanning lines GL in each sub-display area are formed in the second metal layer M2 and a plurality of data lines DL are formed in the first metal layer M1. Alternatively, a plurality of scanning lines GL in each sub-display area are formed in the first metal layer M1 and a plurality of data lines DL are formed in the second metal layer M2. Multiple scanning signal lead wires are formed in other metal layers. As long as different scanning signal lead wires which are connected to adjacent sub-display areas are disposed indifferent films layers, the overpass design of scanning signal lead wires can be achieved.

In this embodiment, multiple scanning signal lead wires Gy in each group of scanning signal lead wires AG include at least a first scanning signal lead wire Gy1, a second scanning signal lead wire Gy2 and a third scanning signal lead wire Gy3 disposed along the row direction. In the first group of scanning signal lead wires AG1, the second scanning signal lead wire Gy2 is disposed on one side of the first scanning signal lead wire Gy, which is closer to the second sub-display area AA2, and the third scanning signal lead wire Gy3 is disposed on one side of the second scanning signal lead wire Gy2, which is closer to the second sub-display area AA2. The first scanning signal lead wire Gy1 in the second group of scanning signal lead wires AG2 sequentially strides over the third scanning signal lead wire Gy3 and the second scanning signal lead wire Gy2 in the first group of scanning signal lead wires AG1 and then is electrically connected to the first scanning signal lead wire Gy1 in the first group of scanning signal lead wires AG1. In the second group of scanning signal lead wires AG2, the second scanning signal lead wire Gy2 strides over the third scanning signal lead wire Gy3 in the first group of scanning signal lead wires AG1 and then is electrically connected to the second scanning signal lead Gy2 in the first group of scanning signal lead wires AG1. . . .

Furthermore, in this embodiment, each scanning signal lead wire Gy includes a trace section Gy01 extending along the row direction and an over-line section Gy02 extending along the column direction, where the over-line section Gy02 of each scanning signal lead wire Gy is electrically connected to a corresponding data line GL through the trace section Gy01. The over-line section Gy02 of the first scanning signal lead wire Gy1 in the second group of scanning signal lead wires AG2, after striding over at least the third scanning signal lead wire Gy3 and the second scanning signal lead wire Gy2 in the first group of scanning signal lead wires AG1, is electrically connected to the first scanning signal lead wire Gy1 in the first group of scanning signal lead wires AG1. The over-line section Gy02 of the second scanning signal lead wire Gy2 in the second group of scanning signal lead wires AG2, after striding over at least the third scanning signal lead wire Gy3 in the first group of scanning signal lead wires AG1, is electrically connected to the second scanning signal lead Gy2 in the first group of scanning signal lead wires AG1. . . .

Similarly, the over-line section Gy02 of the first scanning signal lead Gy1 in the third group of scanning signal lead wires AG3, after striding over at least the third scanning signal lead wire Gy3 and the second scanning signal lead wire Gy2 in the second group of scanning signal lead wires AG2, is electrically connected to the first scanning signal lead wire Gy1 in the second group of scanning signal lead wires AG2. The over-line section Gy02 of the second scanning signal lead wire Gy2 in the third group of scanning signal lead wires AG3, after striding over at least the third scanning signal lead Gy3 in the second group of scanning signal lead wires AG2, is electrically connected to the second scanning signal lead wire Gy2 in the second group of scanning signal lead wires AG2. . . . The over-line section Gy02 of the first scanning signal lead wire Gy1 in the fourth group of scanning signal lead wires AG4, after striding over at least the third scanning signal lead wire Gy3 and the second scanning signal lead wire Gy2 in the third group of scanning signal lead wires AG3, is electrically connected to the first scanning signal lead wire Gy1 in the third group of scanning signal lead wires AG3. The over-line section Gy02 of the second scanning signal lead wire Gy2 in the fourth group of scanning signal lead wires AG4, after striding over at least the third scanning signal lead wire Gy3 in the third group of scanning signal lead wires AG3, is electrically connected to the second scanning signal lead wire Gy2 in the third group of scanning signal lead wires AG3.

In the second group of scanning signal lead wires AG2, since the second scanning signal lead wire Gy2 is disposed on one side of the first scanning signal lead wire Gy1, which is facing away from the first sub-display area AA1, the trace section Gy01 of the second scanning signal lead wire Gy2 has a length greater than a length of the trace section Gy01 of the first scanning signal lead wire Gy1, and in the row direction, the over-line section Gy02 of the second scanning signal lead wire Gy2 is disposed on the right side of the over-line section Gy02 of the first scanning signal lead wire Gy1. Since the third scanning signal lead wire Gy3 is disposed on one side of the second scanning signal lead wire Gy2, which is facing away from the first sub-display area AA1, the trace section Gy01 of the third scanning signal lead wire Gy3 has a length greater than the length of the trace section Gy01 of the second scanning signal lead wire Gy2, and in the row direction, the over-line section Gy02 of the third scanning signal lead wire Gy3 is disposed on the right side of the over-line section Gy02 of the second scanning signal lead wire Gy2.

Similarly, in the third group of scanning signal lead wires AG3, since the second scanning signal lead wire Gy2 is disposed on one side of the first scanning signal lead wire Gy1, which is facing away from the second sub-display area AA2, the trace section Gy01 of the second scanning signal lead wire Gy2 has a length greater than a length of the trace section Gy01 of the first scanning signal lead wire Gy1, and in the row direction, the over-line section Gy02 of the second scanning signal lead wire Gy2 is disposed on the right side of the over-line section Gy02 of the first scanning signal lead wire Gy1. Since the third scanning signal lead wire Gy3 is disposed on one side of the second scanning signal lead wire Gy2, which is facing away from the second sub-display area AA2, the trace section Gy01 of the third scanning signal lead wire Gy3 has a length greater than a length of the trace section Gy01 of the second scanning signal lead wire Gy2, and in the row direction, the over-line section Gy02 of the third scanning signal lead wire Gy3 is disposed on the right side of the over-line section Gy02 of the second scanning signal lead wire Gy2. Therefore, in each group of scanning signal lead wires electrically connected to each corresponding sub-display area, even if scanning signal lead wires are formed in the same film layer, the short circuit problem caused by the intersections in a wiring process doesn't occur.

In this embodiment, electrical connection of scanning lines in each sub-display area is implemented through scanning signal lead wires disposed in the non-display area, and different scanning signal lead wires connected to adjacent sub-display areas are disposed in different film layers, which achieves overpass electrical connection and avoids the short circuit problem in the wiring process. Therefore, the configuration of traces is optimized and the area covered by wiring in the non-display area is reduced, which is advantageous for narrow-bezel design.

Figure 20:
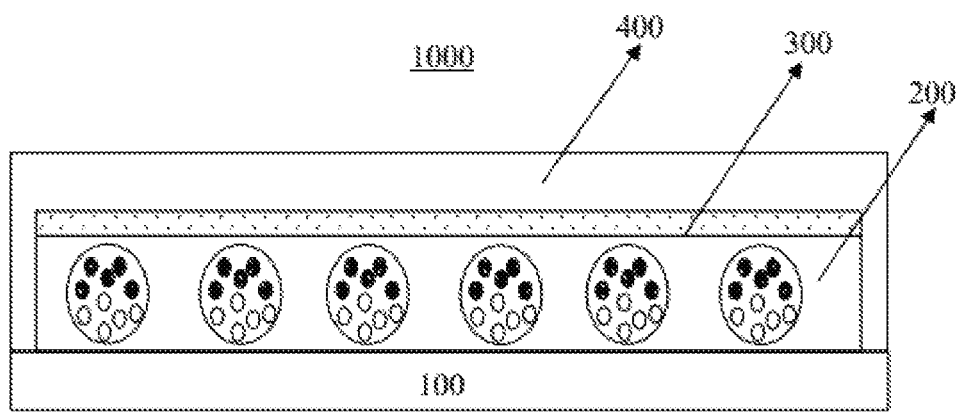
FIG. 20 is a structural diagram of an electronic paper display panel according to an embodiment of the present disclosure.

Moreover, the present disclosure further provides an electronic paper display panel including the array substrate of any embodiment of the present disclosure. FIG. 20 is a structural diagram of an electronic paper display panel according to an embodiment of the present disclosure. The electronic paper display panel 1000 further includes an electrophoretic film 200 and a common electrode layer 300. The electrophoretic film 200 is disposed between the common electrode layer 300 and the array substrate 100 and multiple sub-display areas in the array substrate 100 are covered by the electrophoretic film 200. An electrophoretic layer is disposed in the electrophoretic film 200 and includes multiple electrophoretic particles.

Figure 21:
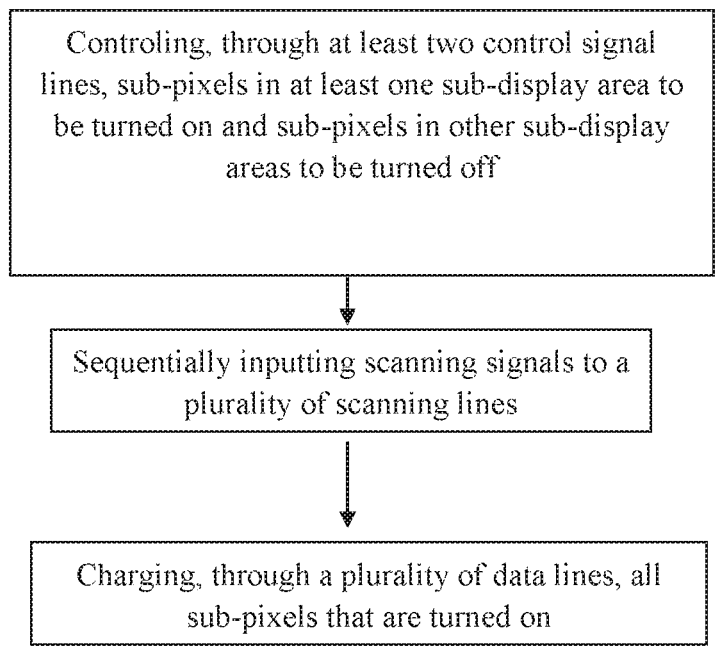
FIG. 21 is a schematic diagram of a drive method for an electronic paper display panel according to an embodiment of the present disclosure.

The present disclosure further provides a drive method for the electronic paper display panel in any one of the above-mentioned embodiments. With reference to FIG. 21, the drive method for the electronic paper display panel provided by this embodiment includes: controlling, through at least two control signal lines, the sub-pixels in at least one sub-display area to be turned on, and meanwhile controlling the sub-pixels in other sub-display areas to be turned off; inputting scanning signals to multiple scanning lines sequentially from top to bottom; and charging, through multiple data lines, all sub-pixels which are turned on. The separate display of multiple sub-display areas may be achieved.

Figure 22:
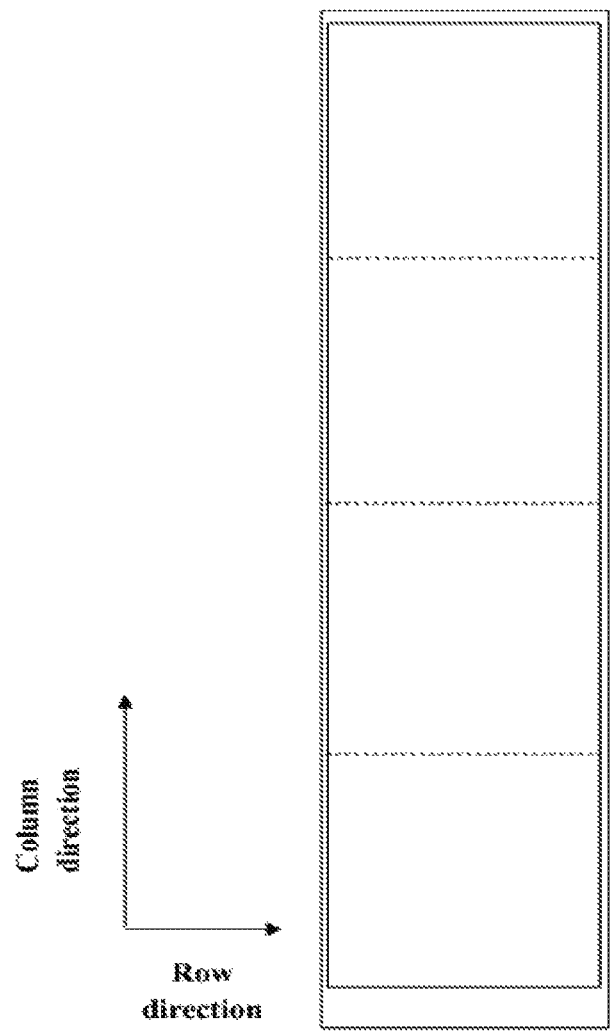
FIG. 22 is a structural diagram of a display device according to an embodiment of the present disclosure.

The present disclosure further provides a display device, and FIG. 22 is a structural diagram of a display device according to an embodiment of the present disclosure. The display device 2000 includes the electronic paper display panel in any embodiment of the present disclosure, the electronic paper display panel includes multiple display areas which can be controlled separately, which can display different pictures simultaneously. Since a smaller number of control chips and/or flexible circuit boards are required, or even one control chip and/or flexible circuit board, a low cost may be achieved. For example, the display device is a vertical display device, where multiple sub-display areas are extended along the column direction and scanning lines in each sub-display area sequentially scan each row from top to bottom, so that the frame refresh from top to bottom in each sub-display area may be achieved according to different requirements of each sub-display area for displaying information and the vertical display device can uses conventional control chips, thereby saving costs. The display device may be, for example, an electronic reader (electronic book), an electronic price tag, an industrial instrument and meter, a dynamic display billboard, a media product, and the like.

It is to be noted that the above are only preferred embodiments of the present application and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. An array substrate, comprising a display area and a non-display area, wherein the display area comprises a plurality of sub-display areas, the display area comprises a plurality of data lines, each of the plurality of sub-display areas comprises a plurality of scanning lines, and the plurality of data lines are intersected with the plurality of scanning lines to form a plurality of sub-pixels; wherein
  in the display area, sub-pixels in a same column are electrically connected to a same data line; wherein
  in each of the plurality of sub-display areas, sub-pixels in a same row are electrically connected to a same scanning line;
  the plurality of scanning lines in each of the plurality of sub-display areas comprise scanning lines numbered from a first scanning line to an Nth scanning line, the plurality of scanning lines in each of the plurality of sub-display areas are electrically insulated from each other, scanning lines having a same scanning line number in different sub-display areas are electrically connected to each other, wherein N is an integer greater than or equal to 3; and wherein
  the array substrate further comprises at least two control signal lines, the plurality of sub-pixels in each of the plurality of sub-display areas are electrically connected to a same control signal line, and sub-pixels in the different sub-display areas are electrically connected to different control signal lines;
  wherein the array substrate further comprises: a plurality of scanning signal lead wires disposed in the non-display area, a first metal layer and a second metal layer; and wherein the scanning lines having a same scanning line number in the different sub-display areas are electrically connected to a same one of the plurality of scanning signal lead wires;

the plurality of sub-display areas are arranged along a column direction, the plurality of data lines are extended along the column direction and arranged along a row direction, the plurality of scanning lines are extended along the row direction and arranged along the column direction, and the plurality of scanning signal lead wires are extended along the column direction and arranged along the row direction; and the plurality of scanning lines are formed in the first metal layer, and the plurality of data lines and the plurality of scanning signal lead wires are formed in the second metal layer.

2. The array substrate according to claim 1, wherein each of the at least two control signal lines comprises a main line extending along the column direction and a plurality of auxiliary lines extending along the row direction and arranged along the column direction, wherein one end of each of the plurality of auxiliary lines is electrically connected to a restive one of the plurality of sub-pixels and another end of the each of the plurality of auxiliary lines is electrically connected to the main line; and wherein the main line is formed in the second metal layer and the plurality of auxiliary lines are formed in the first metal layer.

3. The array substrate according to claim 2, wherein the main line of the each of the at least two control signal lines is disposed in the non-display area and the plurality of auxiliary lines of the each of the at least two control signal lines are extended from the non-display area to the display area.

4. The array substrate according to claim 1, wherein each of the plurality of sub-pixels further comprises a pixel drive module and a pixel electrode, and in each of the plurality of sub-pixels:

a control signal input terminal of the pixel drive module is electrically connected to a respective one of the at least two control signal lines, a scanning signal input terminal of the pixel drive module is electrically connected to a respective one of the plurality of scanning lines, a data signal input terminal of the pixel drive module is electrically connected to a respective one of the plurality of data lines, and a data signal output terminal of the pixel drive module is electrically connected to the pixel electrode.

5. The array substrate according to claim 4, wherein the pixel drive module comprises a first transistor and a second transistor, a first electrode of the first transistor is electrically connected to the respective one of the plurality of data lines, a second electrode of the first transistor is electrically connected to a first electrode of the second transistor, and a second electrode of the second transistor is electrically connected to the pixel electrode; and wherein a control terminal of the first transistor is electrically connected to the respective one of the plurality of scanning lines, and a control terminal of the second transistor is electrically connected to the respective one of the at least two control signal lines; or the control terminal of the first transistor is electrically connected to the respective one of the at least two control signal lines, and the control terminal of the second transistor is electrically connected to the respective one of the plurality of scanning lines.

6. The array substrate according to claim 5, wherein the first transistor and the second transistor are low-temperature polycrystalline silicon thin-film transistors.

7. An electronic paper display panel, comprising the array substrate of claim 1.

8. A drive method for an electronic paper display panel, wherein the electronic paper display panel comprises the array substrate of claim 1, the drive method comprises:

controlling, through the at least two control signal lines, sub-pixels in at least one of the plurality of sub-display areas to be turned on and, meanwhile, controlling sub-pixels in other ones of the plurality of sub-display areas to be turned off;

inputting scanning signals to the plurality of scanning lines sequentially; and charging, through the plurality of data lines, all the sub-pixels which are turned on.

9. An array substrate, comprising a display area and a non-display area, wherein the display area comprises a plurality of sub-display areas, the display area comprises a plurality of data lines, each of the plurality of sub-display areas comprises a plurality of scanning lines, and the plurality of data lines are intersected with the plurality of scanning lines to form a plurality of sub-pixels; wherein in the display area, sub-pixels in a same column are electrically connected to a same data line; wherein in each of the plurality of sub-display areas, sub-pixels in a same row are electrically connected to a same scanning line;

the plurality of scanning lines in each of the plurality of sub-display areas comprise scanning lines numbered from a first scanning line to an Nth scanning line, the plurality of scanning lines in each of the plurality of sub-display areas are electrically insulated from each other, scanning lines having a same scanning line number in different sub-display areas are electrically connected to each other, wherein N is an integer greater than or equal to 3; and wherein the array substrate further comprises at least two control signal lines, the plurality of sub-pixels in each of the plurality of sub-display areas are electrically connected to a same control signal line, and sub-pixels in the different sub-display areas are electrically connected to different control signal lines;

the array substrate further comprises a plurality of connection lines disposed in the display area, a first metal layer, a second metal layer and a third metal layer which are sequentially stacked;

wherein the scanning lines having a same scanning line number in the different sub-display areas are electrically connected to each other through one of the plurality of connection lines;

wherein the plurality of scanning lines are formed in the first metal layer, the plurality of data lines are formed in the second metal layer and the plurality of connection lines are formed in the third metal layer;

wherein the plurality of data lines are extended along a column direction and arranged along a row direction, and the plurality of scanning lines are extended along the row direction and arranged along the column direction; wherein each of the at least two control signal lines comprises a main line and a plurality of auxiliary lines extending along the column direction and arranged along the row direction, wherein one end of each of the plurality of auxiliary lines is electrically connected to a respective one of the plurality of sub-pixels and another end of the each of the plurality of auxiliary lines is electrically connected to the main line; and wherein the main line is formed in the first metal layer and the plurality of auxiliary lines are formed in the third metal layer.

10. The array substrate according to claim 9, further comprising a bonding area, wherein the bonding area is disposed on one side of the array substrate in the column direction and disposed in part of the non-display area corresponding to a first sub-display area; and wherein the plurality of scanning lines in the first sub-display area are extended from the display area to the bonding area and electrically connected to scanning signal pins in the bonding area.

11. The array substrate according to claim 10, further comprising a plurality of data signal lead wires extending along the row direction and arranged along the column direction, wherein the plurality of data lines are electrically connected to data signal pins through the plurality of data signal lead wires, and the plurality of data signal lead wires are formed in the first metal layer.

12. The array substrate according to claim 9, comprising a bonding area, wherein the bonding area is disposed at one end of the array substrate, which is in the column direction and closer to a first sub-display area; and wherein the plurality of data lines are extended from the display area to the bonding area and electrically connected to data signal pins in the bonding area.

13. The array substrate according to claim 12, further comprising a plurality of scanning signal lead wires extending along the column direction and arranged along the row direction, wherein the plurality of scanning lines in the first sub-display area are electrically connected to scanning signal pins in the bonding area through the plurality of scanning signal lead wires; and the plurality of scanning signal lead wires are formed in the third metal layer.

14. The array substrate according to claim 12, further comprising a plurality of control signal lead wires extending along the column direction and arranged along the row direction, wherein the at least two control signal lines are electrically connected to control signal pins in the bonding area through the plurality of control signal lead wires, and the plurality of control signal lead wires are formed in the third metal layer.

15. An array substrate, comprising a display area and a non-display area, wherein the display area comprises a plurality of sub-display areas, the display area comprises a plurality of data lines, each of the plurality of sub-display areas comprises a plurality of scanning lines, and the plurality of data lines are intersected with the plurality of scanning lines to form a plurality of sub-pixels; wherein in the display area, sub-pixels in a same column are electrically connected to a same data line; wherein in each of the plurality of sub-display areas, sub-pixels in a same row are electrically connected to a same scanning line;

the plurality of scanning lines in each of the plurality of sub-display areas comprise scanning lines numbered from a first scanning line to an Nth scanning line, the plurality of scanning lines in each of the plurality of sub-display areas are electrically insulated from each other, scanning lines having a same scanning line number in different sub-display areas are electrically connected to each other, wherein N is an integer greater than or equal to 3; and wherein the array substrate further comprises at least two control signal lines, the plurality of sub-pixels in each of the plurality of sub-display areas are electrically connected to a same control signal line, and sub-pixels in the different sub-display areas are electrically connected to different control signal lines;

the array substrate further comprises multiple groups of scanning signal lead wires disposed in the non-display area; wherein the plurality of sub-display areas comprise a first sub-display area and a second sub-display area disposed adjacently, the multiple groups of scanning signal lead wires comprise a first group of scanning signal lead wires and a second group of scanning signal lead wires, each of a plurality of scanning signal lead wires in the first group of scanning signal lead wires is electrically connected to a respective one of the plurality of scanning lines in the first sub-display area and each of a plurality of scanning signal lead wires in the second group of scanning signal lead wires is electrically connected to a respective one of the plurality of scanning lines in the second sub-display area; and wherein each of the plurality of scanning lines in the first sub-display area is electrically connected to a respective one of the plurality of scanning lines in the second sub-display area through a respective one of the plurality of scanning signal lead wires;

wherein the first group of scanning signal lead wires and the second group of scanning signal lead wires are formed in different metal layers; wherein each group of the multiple groups of scanning signal lead wires comprises a first scanning signal lead wire and a second scanning signal lead wire, and in the first group of scanning signal lead wires, the second scanning signal lead wire is disposed on one side of the first scanning signal lead wire, which is closer to the second sub-display area; and wherein the first scanning signal lead wire in the second group of scanning signal lead wires, across the second scanning signal lead wire in the first group of scanning signal lead wires, is electrically connected to the first scanning signal lead wire in the first group of scanning signal lead wires.

16. The array substrate according to claim 15, wherein each of the plurality of scanning signal lead wires in the second group of scanning signal lead wires comprises a trace section extending along a row direction and an over-line section extending along a column direction, and the over-line section is electrically connected to a respective scanning line through the trace section; and the over-line section of the first scanning signal lead wire in the second group of scanning signal lead wires, across the second scanning signal lead wire in the first group of scanning signal lead wires, is electrically connected to the first scanning signal lead wire in the first group of scanning signal lead wires.

17. The array substrate according to claim 16, wherein in the second group of scanning signal lead wires, the second scanning signal lead wire is disposed on one side of the first scanning signal lead wire facing away from the first sub-display area; wherein the second scanning signal lead wire in the second group of scanning signal lead wires is electrically connected to the second scanning signal lead wire in the first group of scanning signal lead wires; and wherein in the second group of scanning signal lead wires, the trace section of the second scanning signal lead wire has a length larger than a length of the trace section of the first scanning signal lead wire, and in the row direction, the over-line section of the second scanning signal lead wire is disposed on a right side of the over-line section of the first scanning signal lead wire.

18. The array substrate according to claim 15, further comprising a first metal layer and a second metal layer which are sequentially stacked, wherein the plurality of scanning lines are formed in the first metal layer and the plurality of data lines are formed in the second metal layer; and wherein
    the first group of scanning signal lead wires are formed in the first metal layer and the second group of scanning signal lead wires are formed in the second metal layer.

\* \* \* \* \*